(12) United States Patent
Leclerc et al.

(10) Patent No.: US 12,055,984 B2
(45) Date of Patent: Aug. 6, 2024

(54) COMPUTER IN AN INPUT DEVICE

(71) Applicant: Apple Inc., Cupertino, CA (US)

(72) Inventors: Michael E. Leclerc, Sunnyvale, CA (US); Brett W. Degner, Menlo Park, CA (US); Ian P. Shaeffer, Los Gatos, CA (US)

(73) Assignee: APPLE INC., Cupertino, CA (US)

( * ) Notice: Subject to any disclaimer, the term of this patent is extended or adjusted under 35 U.S.C. 154(b) by 10 days.

(21) Appl. No.: 17/444,269

(22) Filed: Aug. 2, 2021

(65) Prior Publication Data
US 2022/0057845 A1 Feb. 24, 2022

Related U.S. Application Data

(60) Provisional application No. 63/067,783, filed on Aug. 19, 2020.

(51) Int. Cl.
*G06F 1/16* (2006.01)
*G06F 1/18* (2006.01)
*G06F 1/20* (2006.01)

(52) U.S. Cl.
CPC .......... *G06F 1/1684* (2013.01); *G06F 1/181* (2013.01); *G06F 1/203* (2013.01)

(58) Field of Classification Search
CPC ........ G06F 1/1681; G06F 1/181; G06F 1/203; G06F 3/021; G06F 3/0221; G06F 1/1666; H03K 17/9622; H03K 17/9643
See application file for complete search history.

(56) References Cited

U.S. PATENT DOCUMENTS

| 10,642,385 | B1 | 5/2020 | Song et al. |
| 11,079,816 | B1 * | 8/2021 | North ............ G06F 3/016 |
| 2013/0335905 | A1 * | 12/2013 | Xu ............ G06F 3/0221 |
| | | | 361/679.08 |

(Continued)

FOREIGN PATENT DOCUMENTS

| CN | 108227835 A | * | 6/2018 | ........ G06F 1/1616 |
| JP | 2001332881 A | | 11/2001 | |

OTHER PUBLICATIONS

'G Series Gaming Notebook PC'. ASUS—GX550L(WS/XS) User's Manual for English Edition [online]. First edition. May 2020 [retrived on Nov. 22, 2023]. Retrieved from the internet: <URL: https://www.asus.com/supportonly/rog%20zephyrus%20duo%2015/helpdesk_manual/ > (Year: 2020).*

(Continued)

*Primary Examiner* — James Wu
(74) *Attorney, Agent, or Firm* — Dorsey & Whitney LLP

(57) ABSTRACT

A computing device can include an enclosure that defines an internal volume and an external surface. An input component can be positioned at the external surface. A processing unit and a memory can be communicatively coupled and disposed within the internal volume. A singular input/output port can be positioned at an orifice defined by the enclosure. The singular input/output port can be communicatively coupled to the processing unit and the memory. The singular input/output port can be configured to receive data and power and configured to output data from the processing unit. The computing device can include an air-moving apparatus to move air along an airflow pathway. The enclosure can include a thermally conductive base.

13 Claims, 15 Drawing Sheets

(56) References Cited

U.S. PATENT DOCUMENTS

2016/0327986 A1* 11/2016 Farahani ................. G06F 1/169
2020/0135419 A1* 4/2020 Nakano ................. H01H 13/86
2022/0035420 A1* 2/2022 Wang .................... G06F 1/1647

OTHER PUBLICATIONS

PiPO, KB1 (Mini PC), available at www.pipo.com/product.php?id-235, available at least as early as Aug. 2020.

* cited by examiner

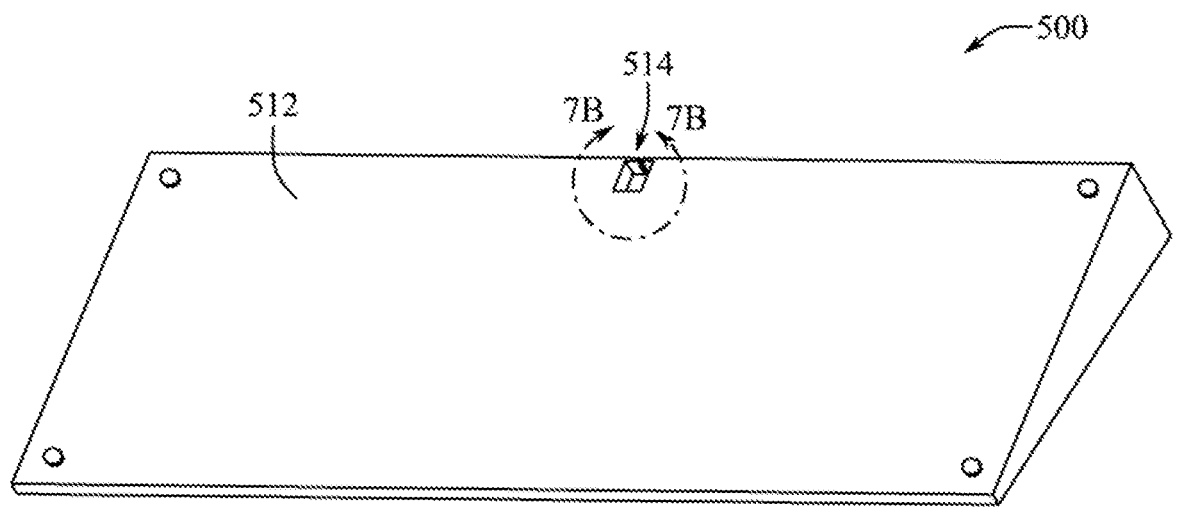
*FIG. 7A*
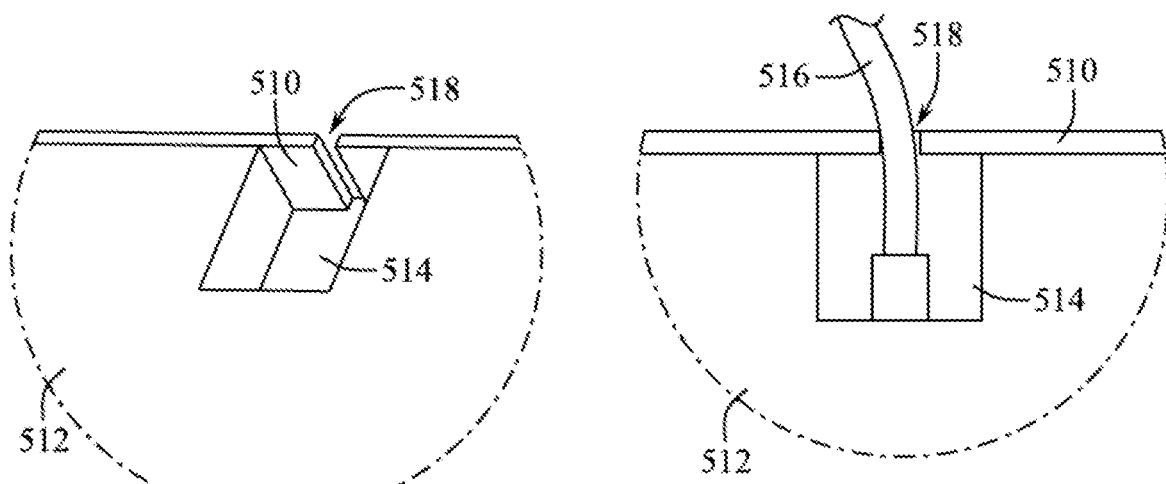
*FIG. 7B*
*FIG. 7C*

COMPUTER IN AN INPUT DEVICE

CROSS-REFERENCE TO RELATED APPLICATION(S)

This claims priority to U.S. Provisional Patent Application No. 63/067,783, filed 19 Aug. 2020, and entitled "Computer in an Input Device," the entire disclosure of which is hereby incorporated by reference.

FIELD

The described embodiments relate generally to computing devices. More particularly, the present embodiments relate to computing and input devices.

BACKGROUND

Large or bulky computing components have traditionally been needed within computing devices to achieve a desired level of performance, such as a desired amount of memory or a desired level of computing power. Housings for such computing devices were thus constrained to designs including relatively large or uninterrupted internal volumes. Other performance requirements for the computing devices also limited the housings to certain form factors.

A strong demand for portable computing devices which also deliver high performance has driven miniaturization and reduction in size of the once bulky computing components used to power and drive the devices. Components, such as processors, batteries, memory, integrated circuits, and the like are now being manufactured within smaller footprints to provide lightweight and thin portable computing devices. Consequently, further tailoring of housing designs, shapes, and configurations to provide additional or enhanced device functionality can therefore be desirable.

SUMMARY

One aspect of the present disclosure relates to a computing device having an enclosure that at least partially defines an internal volume and an external surface. The computing device includes an input component positioned at the external surface. A processing unit and a memory can be disposed within the internal volume. The processing unit and the memory can be communicatively coupled. The computing device includes a singular input/output port positioned at an orifice defined by the enclosure. The singular input/output port is communicatively coupled to the processing unit and the memory. The singular input/output port can be configured to receive both data and power. The singular input/output port can be configured to output data from the processing unit.

In some embodiments, the enclosure can include metal or composite material. The computing device can further include a track pad communicatively coupled to the enclosure. The input component can include a set of key mechanisms, each key mechanism of the set of key mechanisms can include a key cap, a support structure, and a biasing component. The input component can include a set of sensors, each sensor of the set of sensors can be configured to detect a capacitive touch or near touch at a surface layer of the input component. The computing device can include a power supply disposed within the internal volume. The singular input/output port can include a USB-C port, a Thunderbolt 3 port, or a Lightning port.

In some embodiments, the enclosure can define a vent to provide fluid communication between an ambient environment and the internal volume. The enclosure can include a first side wall, a second side wall, a rear-facing wall positioned between the first and second side wall, and a base. The computing device can be foldable about an axis, parallel to the rear-facing wall. The computing device can be foldable about an axis perpendicular to the rear-facing wall. The enclosure can define a majority volume and a minority volume, wherein the majority volume is positioned on a first side of a plane extending between the first and second side walls, and the minority volume is positioned on a second side of the plane. The plane can bisect the first and second side walls in half. A cross-sectional shape of the enclosure taken between the first and second side walls can be triangular.

Another aspect of the present disclosure relates to a computing device having an enclosure defining an internal volume, a first vent, a second vent, and an airflow pathway. The airflow pathway can extend from an ambient environment into the internal volume through the first vent, and from the internal volume into the ambient environment through the second vent. The enclosure can include a first side wall, a second side wall, a rear-facing wall, and a base. The rear-facing wall can be positioned between the first and second side walls. The computing device can include an input component positioned on the enclosure. The computing device can include a processing unit and a memory disposed within the internal volume. The processing unit and the memory can be communicatively coupled to one another. The computing device can include an air-moving apparatus disposed within the internal volume. The air-moving apparatus can move air along the airflow pathway.

In some embodiments, the enclosure can include a metal or composite material. The computing device can include a track pad coupled to the enclosure. The input component can include a set of key mechanisms, each key mechanism of the set of key mechanisms including a key cap, a support structure, and a biasing component. The input component can include a set of sensors, each sensor of the set of sensors can detect a capacitive touch or near touch at a surface layer of the input component. The computing component can also include a power supply disposed within the internal volume. The air-moving apparatus can be a bladed fan in some embodiments. The second vent can be defined in the rear-facing wall. The processing unit can be positioned in the airflow pathway.

In some embodiments, the computing device is foldable about an axis parallel to the rear-facing wall. Additionally or alternatively, the computing device can be foldable about an axis perpendicular to the rear-facing wall. The enclosure can define a majority volume and a minority volume. The majority volume can be positioned on a first side of a plane extending between the first and second side walls while the minority volume can be positioned on a second side of the plane. The plane can bisect the first and second side walls in half. A cross-sectional shape of the enclosure taken between the first and second side walls can be triangular.

According to another aspect of the present disclosure, a computing device can include an enclosure defining an internal volume and an external surface. The enclosure can include a first side wall, a second side wall, a rear-facing wall positioned between the first and second side walls, and a base including a thermally conductive material. The computing device can include an input component positioned at the external surface. The computing device can include a processing unit and a memory disposed within the internal volume. The processing unit and the memory can be communicatively coupled to one another. The processing unit can be in thermal communication with the base. The computing device can include an air-moving apparatus disposed within the internal volume.

In some embodiments, the enclosure can include aluminum. The input component can include a set of key mechanisms, each key mechanism of the set of key mechanisms including a key cap, a support structure, and a biasing component. The input component can further include a sealing member positioned between the key mechanisms to prevent ingress of contaminants into the internal volume. The enclosure can be sealed to prevent ingress of contaminants into the internal volume. The computing component can also include a power supply disposed within the internal volume. In some embodiments, the power supply includes an inductive charging coil. The base can include a metal or a metal alloy, such as aluminum.

BRIEF DESCRIPTION OF THE DRAWINGS

The disclosure will be readily understood by the following detailed description in conjunction with the accompanying drawings, wherein like reference numerals designate like structural elements, and in which:

FIG. 7A shows a bottom-perspective view of a computing device.

FIG. 7B shows a detailed view of the computing device of FIG. 8A.

FIG. 7C shows a bottom view of the computing device of FIG. 8A.

DETAILED DESCRIPTION

Figure 1A:
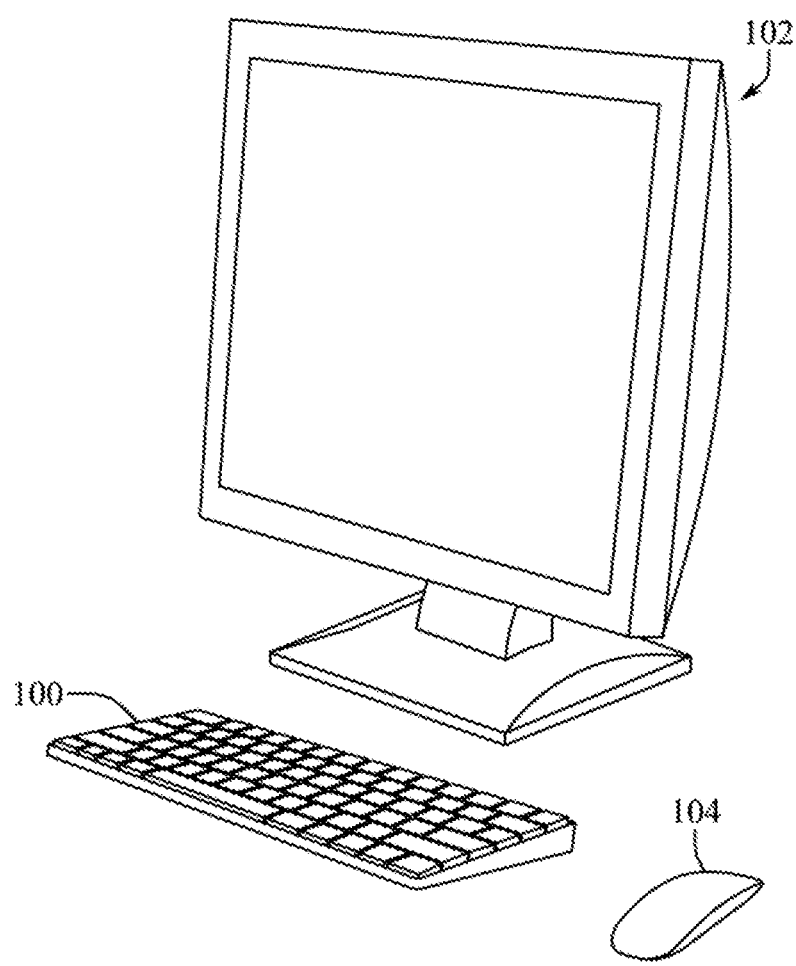
FIG. 1A shows a perspective view of a computing system, according to some embodiments of the present disclosure.

Reference will now be made, in detail, to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In some examples, an input device, such as a keyboard, can include all of the components of a high performance computer within the housing of the device. For example, a computing device can include an enclosure at least partially defining an internal volume and an external surface. The computing device can include an input component positioned at the external surface. The computing device can include a processor disposed within the internal volume, and a memory communicatively coupled to the processor. The memory can be disposed within the internal volume. The computing device can further include a singular input/output port positioned at an orifice defined by the enclosure. The singular input/output port can be communicatively coupled to the processor and the memory. The singular input/output port can receive data and/or power from one or more ancillary devices (e.g., a computer monitor). The singular input/output port can also output data and/or power from the processor to one or more ancillary devices (e.g., a computer monitor) positioned adjacent the computing device.

Many users own or operate computing devices which are regularly, if not exclusively, utilized in a particular location, like a desktop computing device within an office or a home-office. These computing devices generally include a tower (e.g., a stand-alone housing containing the processor, memory and other components of the computer), one or more computer monitors, and one or more input devices, such as a keyboard, a mouse, a track pad, or a combination thereof. Input devices, such as a keyboard, can be vital for a user of the computing device to efficiently and easily deliver input to, and to control the computing device. When a user of the computing device desires to operate the computing device from multiple distinct locations, this traditional configuration can require that the user transport the entire computing system, including the tower, between locations.

To transport a tower and/or input devices of a desktop computer to another location, multiple cords and cables may need to be removed and organized. Moreover, when transporting a tower and/or input devices from one location to another, the various components risk becoming damaged, and the cords or cables need to be repositioned and plugged back into their respective ports. This process can be inconvenient, awkward, and difficult, especially when frequently repeated.

Although portable computing devices, such as laptops and tablets, can be docked at an office or home-office station that includes a secondary display to provide a computing experience that is similar to a desktop computing experience, these devices still require an additional set of input devices to imitate a desktop computing device. Further, the primary display of devices such as laptops and tablets often may not be used when the device is docked to a station that includes a secondary display, adding potentially unnecessary size and cost to such portable computing devices.

The computing devices described herein can incorporate or otherwise house one or more computing components within an input device to provide a portable desktop computing experience at any location having one or more computer monitors. For example, a user can transport a keyboard that houses a computer, as opposed to carrying an entire laptop or a tower and keyboard. As some form of an input device is often required for interacting or interfacing with a computing device, including computing components within the housing or enclosure of an input device can eliminate the need for redundant sets of input devices and reduces the number of components that need to be transported by the user. Further, the input device can eliminate additional components, such as displays, that are not required when used with a standalone computer monitor, thereby reducing costs and size. Accordingly, in some examples, an input device can include computing components within the housing of the input device. This device configuration can allow a user to carry a single computing device (e.g., computing components within an input device) that can provide a desktop computing experience at any location having one or more computer monitors.

The combination computing and input devices described herein can include features, designs, and system architectures that can allow for desired levels of performance while maintaining a form factor that is the same as or similar to the form factor of a traditional input device. In some examples, a computing device can include an enclosure defining first and second vents. The enclosure can define an airflow pathway from an ambient environment adjacent the enclosure through the first vent and into an internal volume of the enclosure. The airflow pathway can extend from the internal volume through the second vent and into the ambient environment. One or more air-moving apparatuses positioned within the internal volume can move air along the airflow pathway. In some examples, these features can provide desired levels of cooling or thermal management to a device to allow for desired levels of performance.

In some examples, the computing device can include an enclosure having a thermally conductive base. The computing device can include a processing unit in thermal communication with the base. The processing unit can generate heat while operating, which can negatively impact the performance of the processing unit. The base, however, can be manufactured at least partially of a material that distributes or spreads heat substantially through the mass of the base (i.e., thermally conductive), thereby more evenly spreading or distributing heat generated by the processing unit over a larger surface area of the base to more effectively regulate operating temperatures of the computing device. Some non-limiting examples of thermally conductive materials are copper, aluminum, brass, steel, and bronze.

These and other embodiments are discussed below with reference to FIGS. 1A-9. However, those skilled in the art will readily appreciate that the detailed description given herein with respect to these Figures is for explanatory purposes only and should not be construed as limiting.

FIG. 1A shows an example of an electronic device, such as a computer or a computing device, as described herein. The computing device 100 shown in FIG. 1A can also function as an input device, such as a keyboard, and can be used with a display 102. This is, however, merely one representative example of a computing device that can be used in conjunction with the ideas disclosed herein. The computing device 100 can, for example, correspond to a virtual keyboard, a track pad or touchpad, a mouse, a tablet computer, a combination thereof, or other input devices. The computing device 100 shown in FIG. 1A can be generally referred to as a keyboard having computing components which permit the keyboard to function as a desktop computing device. As shown, the computing device 100 can be used in conjunction with any number of monitors or displays 102, as well as other input devices such as a mouse 104, a track pad (see FIG. 5), a stylus (not shown), a microphone (not shown), or any combination of input devices.

Figure 1B:
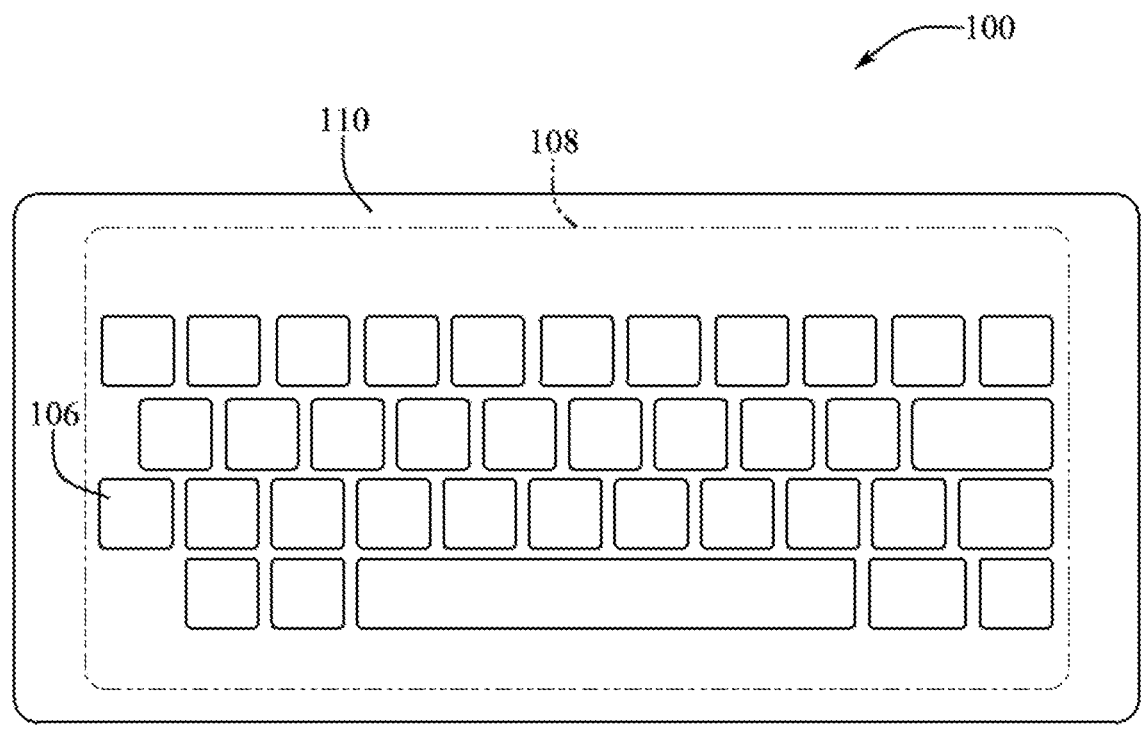
FIG. 1B shows a top view of a computing device.

FIG. 1B shows a top view of a computing device 100 including an input region 108 positioned on a top portion of the enclosure 110 of the computing device 100. The computing device 100 can be substantially similar to, and can include some or all of the features of the computing devices described herein. The computing device 100 can be generally referred to as a keyboard having computing components which permit the keyboard to function as a computing device. The computing device 100 can be used in conjunction with any number of monitors or displays and, as well as other input devices such as a mouse, a track pad, a stylus, a microphone, or any combination of input devices.

The computing device 100 can include the input region 108 across the top portion of the enclosure 110 of the computing device 100. The input region 108 can include any number or variety of input components. In some examples, the input region 108 can include an accessory display, such as any appropriate display element (e.g., an LCD display, E-Ink display, LED display, or any other form of display), illumination layer (e.g., LEDs or the like), and/or any other component configured to depict a graphical output. The input region 108 can be adaptable such that it is continually defined by all of, or a subset of, an area of the enclosure 110 of the computing device 100. The enclosure 110 of the computing device 100 can contain or conceal one or more sensors (e.g., a capacitive array, or a piezoelectric element) to allow the input region 108 to detect a touch and/or force input and produce a corresponding electrical response for controlling the computing device 100. In some examples, the input region 108 can be defined by or can include a sensing region of one or more sensors, such as one or more sensors to detect a position of a part of a user's body with respect to the device 100. In some examples, the input region 108 can be defined by a projection from one or more components, such as a projection of a virtual keyboard from a projector contained in the enclosure 110.

The computing device 100 can include various sensors to detect input, such as capacitive touch or near touch, at the input region 108. The various sensors can be or can include a capacitive array that produces an electrical response in response to a touch input or a near touch input at the input region 108. Additionally or alternatively, piezoelectric or other strain-sensitive elements can produce an electrical response in response to a force input or a deformation of the variable input region 108. In some examples, other sensors are contemplated. The computing device 100 can use the electrical response of the sensor(s) to control a function of the computing device 100 and to provide haptic feedback (e.g., a tactile vibration) to the input region 108.

In some examples, the input region 108 can receive a touch and/or force input to generate a user input signal. To illustrate, the computing device 100 can define an array of sub-input regions 106 that can be or can include physical key mechanisms and/or virtual keys at the input region 108. Each sub-input region 106 can be associated with a particular function executable by the computing device 100. Various indicia (e.g., alpha-numeric symbols or the like) can be displayed at the input region 108 or within the sub-input regions 106 that are indicative of the predetermined functions at a corresponding sub-input region 106. In some examples, however, indicia can be printed or otherwise illustrated at the input region 108 or within the sub-input regions 106. One or more sensors of the user computing device 100 (e.g., a capacitive array, a strain-sensitive element) can be configured to produce an electrical response upon the detection of a touch and/or force input at the variable input region 108. Accordingly, the user computing device 100 can generate a user input signal based on the predetermined function associated with the one or more sensors.

In some examples, one or more haptic elements can provide localized haptic feedback to the input region 108, for example, at or near the location of the received touch and/or force input. Additionally or alternatively, haptic feedback can be provided to the input region 108 to indicate to a user a boundary of sub-input regions 106 (e.g., causing a tactile vibration when a user's finger traverses a perimeter of a virtual key). This can simulate a keyboard surface having discrete keys (e.g., as a keyboard having mechanically actuated key caps), but over a substantially flat dimensionally variable input region 108. In some examples, however, the input region 108 can additionally or alternatively include an input component, such as a keyboard, including discrete keys, such as mechanically actuated keys. The components involved in producing a haptic response can include an input surface and one or more actuators (such as piezoelectric transducers, electromechanical devices, and/or other vibration inducing devices). In some examples, the input region 108 can be defined by any variety of input device including, but in no way limited to capacitive touch inputs, mechanical inputs, or optically sensed inputs.

Figure 1C:
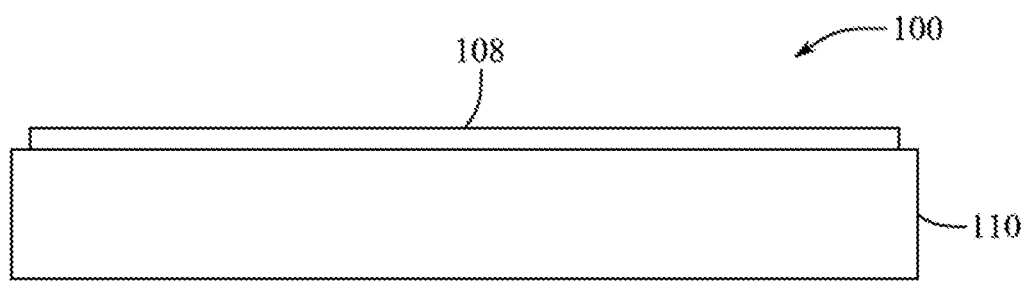
FIG. 1C shows a side view of the computing device of FIG. 1B.

FIG. 1C shows a side view of the computing device 100 shown in FIG. 1B. As can be seen, in some examples, the computing device can include an enclosure 110 that can include one or more computing components and an input region 108 that can be present at, or that can at least partially define, an exterior surface of the computing device 100. In some examples, the one or more components defining the input region 108 can protrude from the enclosure 110. For example, where the input region 108 is defined by physical input components, such as keys, the keys can protrude a given distance from the enclosure 110. In some examples where the input region 108 is defined by a touch screen, the touch screen component itself can protrude from the enclosure 110. In some examples, however, the input region 108 can be substantially flush or level with all or a portion of an exterior surface defined by the enclosure 110.

Figure 1D:
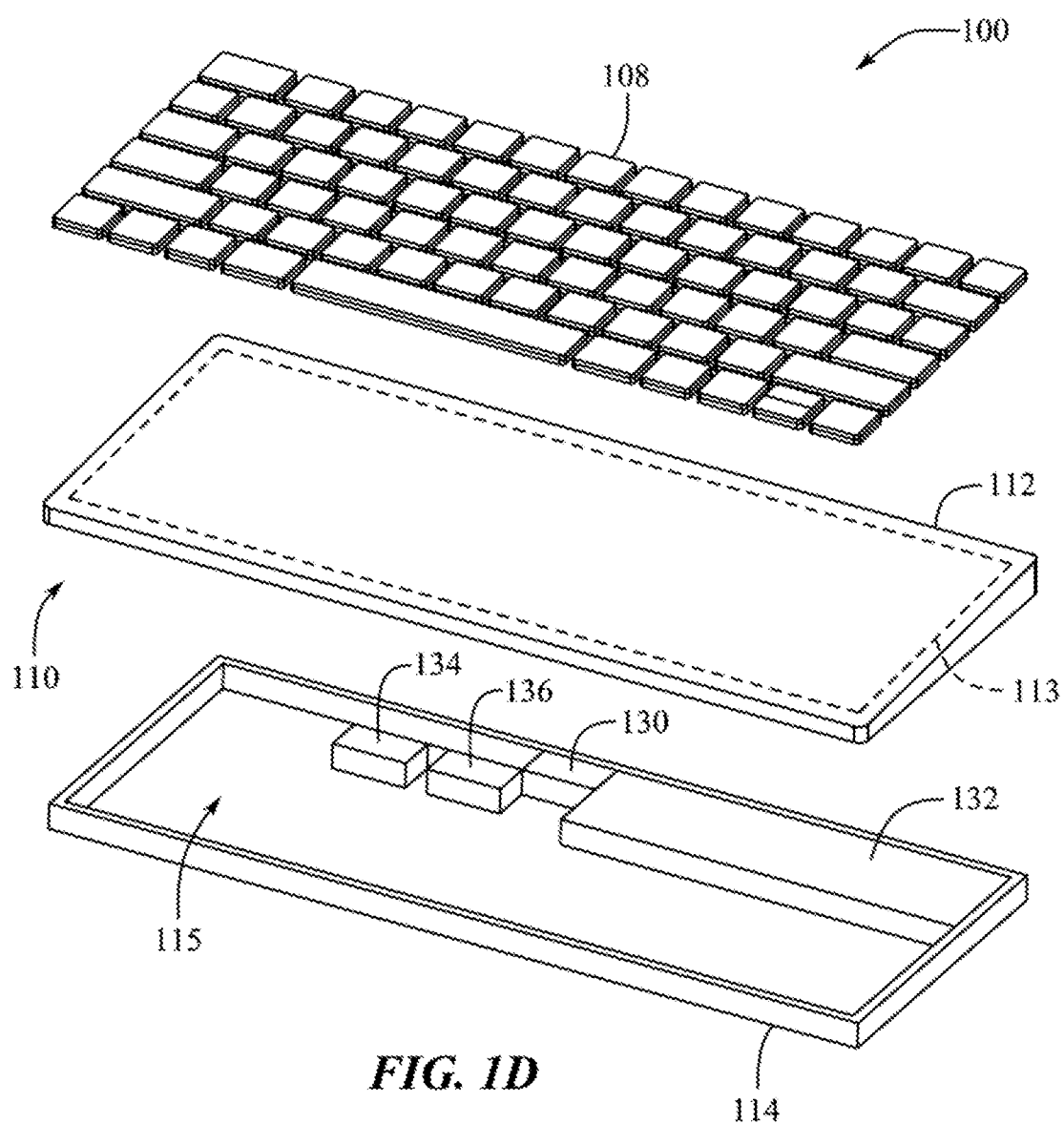
FIG. 1D shows an exploded view of the computing device of FIG. 1B.

FIG. 1D shows an exploded view of the device 100 illustrated in FIG. 1B. In some examples, portions of the enclosure 110 can be disassembled or separated from one another, for example, a first portion, such as base 114 of the enclosure 110 can be separable from at least a second portion, such as a top portion 112. The base 114 and the top portion 112 can be interconnected or otherwise formed from a single piece of material (e.g., metal, plastic, or ceramic).

In some examples, the top portion 112 of the enclosure 110 can define feature or region 113 that can at least partially hold, support, define, or surround the input region 108, for example, as defined by an input component. In some examples where the input region 108 is defined by keys of a keyboard, the feature 113 can include any number of apertures defined by the top portion 112. In some examples, where the input region 108 includes a display, the feature 113 can include a single aperture defined by the top portion 112. In some examples, the enclosure can at least partially define an internal volume 115 of the device 100. For example, the base 114 can at least partially define the internal volume 115 that can further be defined by other portions 112 of the enclosure 110 and/or an input component 108.

In some examples, one or more computing components can be positioned at any desired location in the internal volume 115 defined by the enclosure 110. As shown in FIG. 1D, a processing unit 132 and the memory 136 are positioned within an internal volume or an inner cavity 115 defined by the enclosure 110. The processing unit 132 can be operatively connected to the memory 136. In some examples, the device 100 can include additional computing or other components in the internal volume 115, and can be operatively coupled to the processing unit 132 and/or memory 136. For example, the device 100 can include an input/output component 130 positioned in the internal volume 115. The device 100 can also include an operational component 134 positioned in the internal volume 115. In some examples, the operational component 134 can include any desired variety or combination of electronic components and can provide additional functionalities to the device 100. In some examples, the operational component 134 can be selected based at least partially on a desired functionality of the device 100. For example, where a user might desire the device 100 to have wireless internet connectivity, the component 134 can include a cellular antenna. In some examples, however, the operational component 134 can additionally or alternatively include other desired components, such as additional memory. Further details of the computing device 200 are provided below with reference to FIGS. 2A-2E and FIG. 3.

Figure 4A:
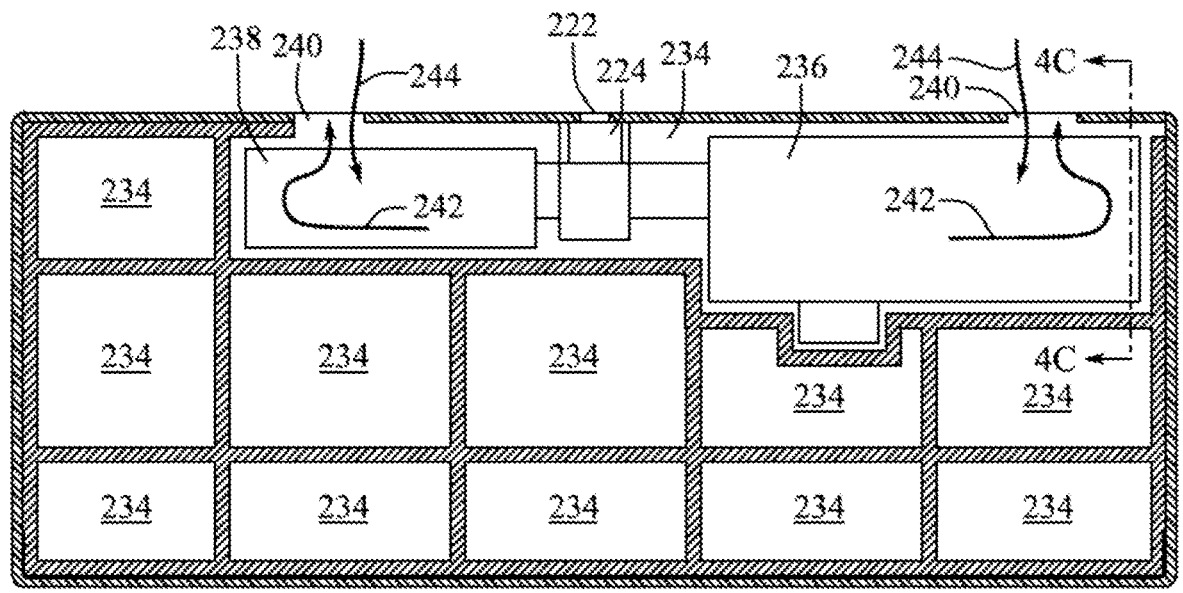
FIG. 4A shows a top cross-section view of a computing device.
Figure 4B:
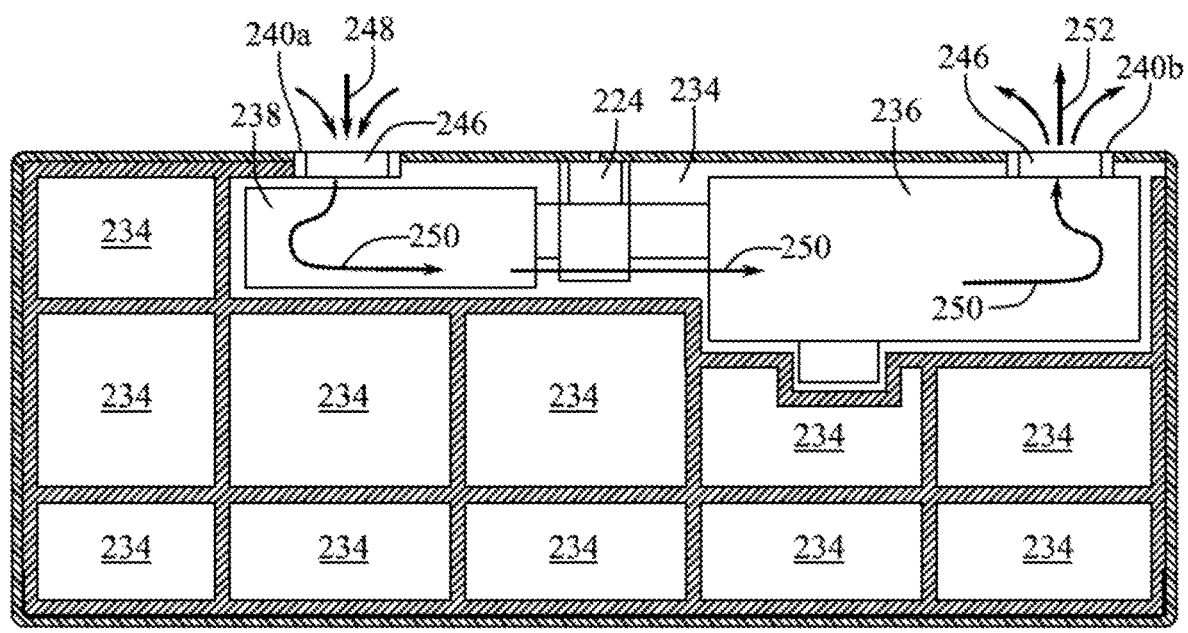
FIG. 4B shows a top cross-section view of a computing device.
Figure 4C:
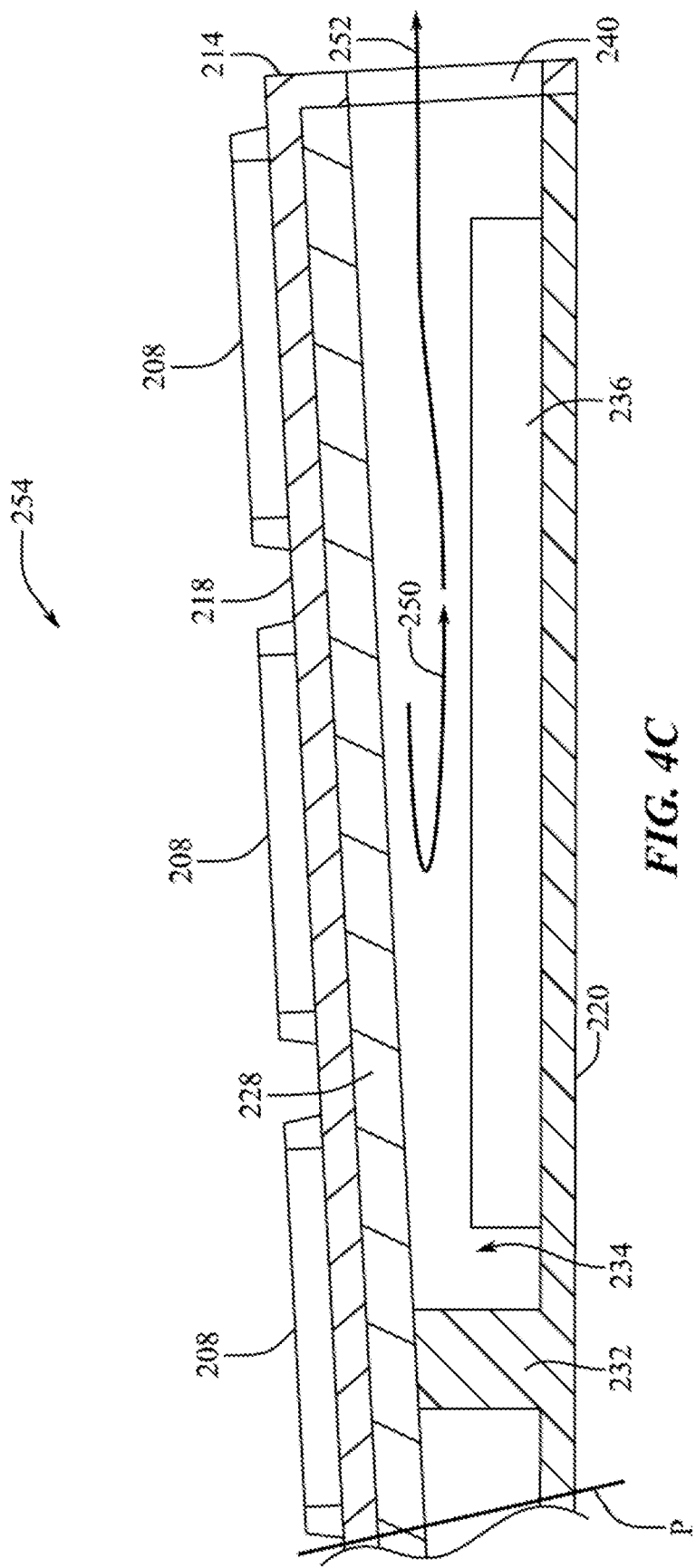
FIG. 4C shows a side cross-section view of the computing device of FIG. 4A.

FIGS. 2A-2E show various views of a computing device 200. The computing device 200 can be substantially similar to, and can include some or all of the features of any of the computing devices described herein, such as computing device 100. As shown, the computing device 200 can include an enclosure 206 and an input component, for example, one or more keys 208 positioned at an exterior surface defined by the enclosure 206. In some examples, the enclosure 206 can include a first side wall 210, a second side wall 212, a rear-facing wall 214, a forward-facing wall 216, a top portion 218, and a base 220, shown in FIG. 2C. The rear-facing and forward-facing walls 214, 216 can be positioned between the first and second side walls 210, 212. The first and second side walls 210, 212, the rear-facing wall 214, the forward-facing wall 216, the top portion 218, and the base 220 can define or form an internal volume or inner cavity. One or more components of the computing device 200 can be positioned within the internal volume or inner cavity, for example, a processor and memory can be positioned in the cavity, as shown in FIGS. 4A-4C.

One or more of the first and second side walls 210, 212, the rear-facing wall 214, the forward-facing wall 216, the top portion 218, or the base 220 can define or form an external surface of the enclosure 206. One or more elements can be affixed or formed within the external surface of the enclosure 206. For example, one or more buttons, switches, knobs, capacitive touch input surfaces, input/output ports, vents, apertures, recesses, or other features can be formed within, be defined by, be positioned at, or be affixed to the external surface of the enclosure 206. The top portion 218 can be non-parallel to the base 220 such that the enclosure 206 forms a wedge shape that tapers from the rear-facing wall 214 to the forward-facing wall 216.

Figure 2A:
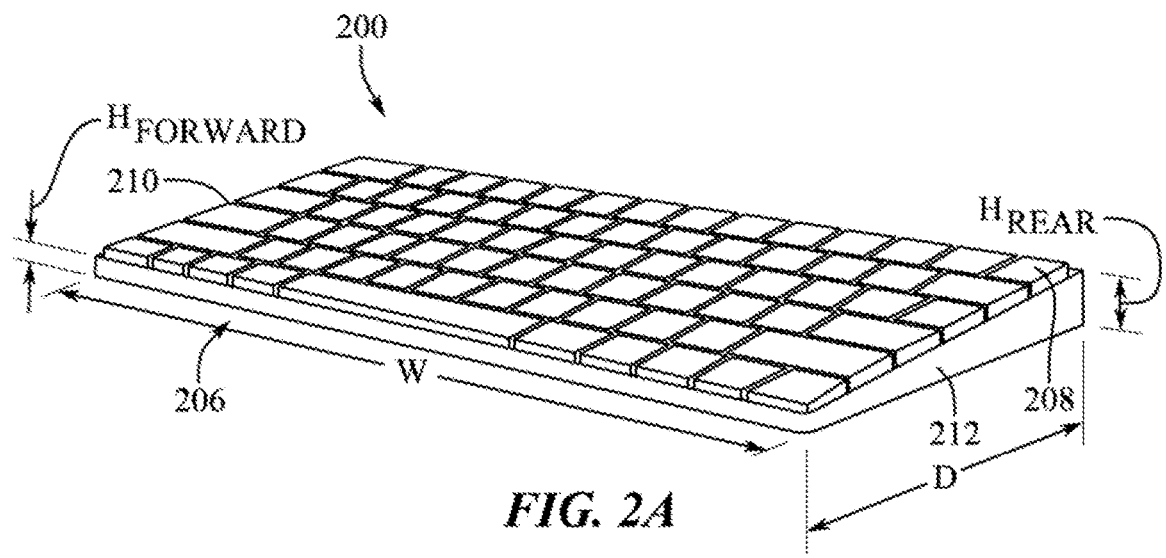
FIG. 2A shows a perspective view of a computing device.
Figure 2B:
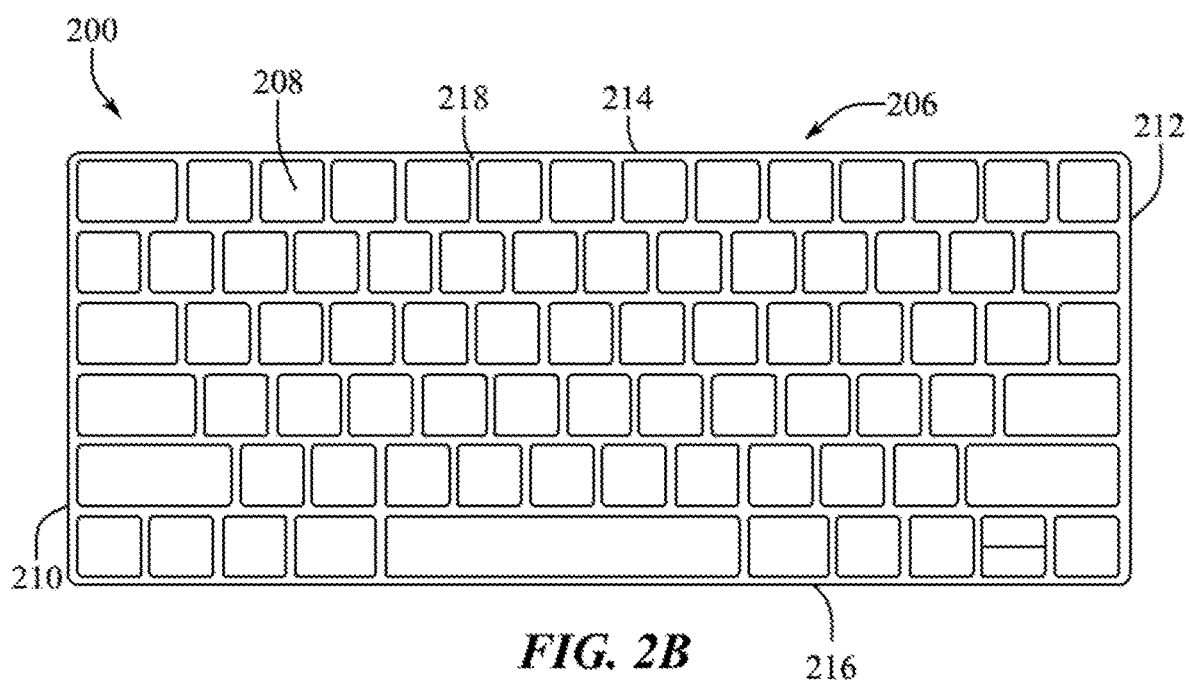
FIG. 2B shows a top view of the computing device of FIG. 2A.
Figure 2C:
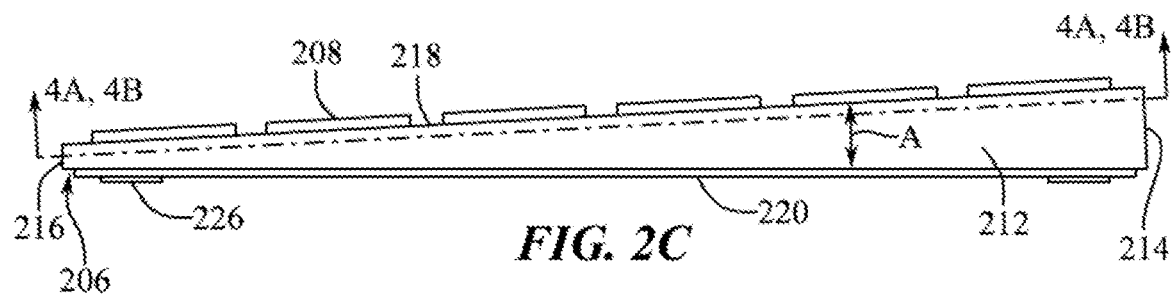
FIG. 2C shows a side view of the computing device of FIG. 2A.

In some examples, as shown in FIG. 2A, the enclosure 206 can have a width W that can be the width of the forward-facing and/or rear-facing walls 216, 214. The enclosure can have a depth D that can be a respective depth, or length of the first or second sidewalls 210, 212 of the enclosure 206. In some examples, a ratio of the width W to the depth D can be between about 1 and about 5, or between about 2 and about 3, for example, about 2.4, about 2.45, or about 2.5. In some examples, the width W can be between about 10 cm and about 50 cm, between about 25 cm and about 35 cm, or between about 25 cm and about 30 cm. In some examples, the depth D can be between about 5 cm and about 20 cm, between about 10 cm and about 15 cm, or between about 10 cm and about 12 cm. In some examples, the height $H_{FORWARD}$ of the forward-facing wall 210 can be between about 1 cm and about 10 cm, or between about 2 cm and about 5 cm, for example, about 4 cm. In some examples, a height $H_{REAR}$ of the rear-facing wall 214 can be about between about 5 cm and about 20 cm, or between about 10 cm and about 15 cm, or between about 10 cm and about 12 cm. In some examples, a ration of the height $H_{REAR}$ to the height $H_{FORWARD}$ can be between about 1 and about 5, or between about 2 and about 3, for example, about 2.7, about 2.75, or about 2.8. In some examples, and as shown in FIG. 2C, the angle A between the top portion 218 and the base 220, for example, as defined by the forward-facing wall 210 and the rear-facing wall 214, can be between about 0 degrees and about 45 degree, or between about 20 degrees and about 40 degrees. In some examples, the angle A can be about 30 degrees.

As used herein, the terms exterior, outer, interior, inner, front, rear, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

In some examples, a user provides input to the computing device 200 by pressing one or more of the keys 208. Each of the keys 208 can include a respective indicia or symbol printed, etched, or otherwise provided on a surface of the key 208 to form an alphanumeric keyboard (e.g., a QWERTY type keyboard, etc.). Additionally or alternatively, one or more of the keys 208 can alter or vary operation aspects of the computing device 200, for example, by adjusting an intensity of a backlight behind the keys 208 or by varying a magnitude of volume emitted from a speaker (not shown) housed within the enclosure 206.

Figure 2D:
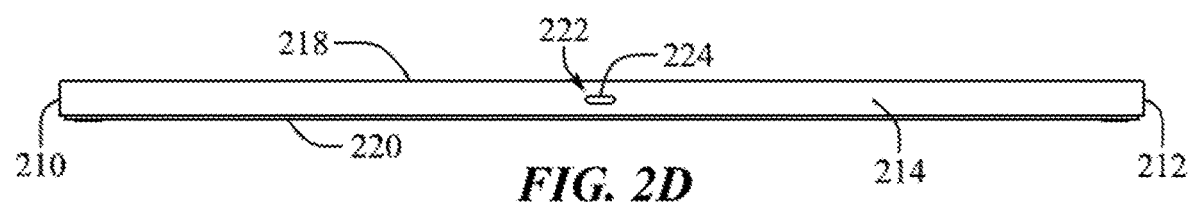
FIG. 2D shows a rear view of the computing device of FIG. 2A.
Figure 2E:
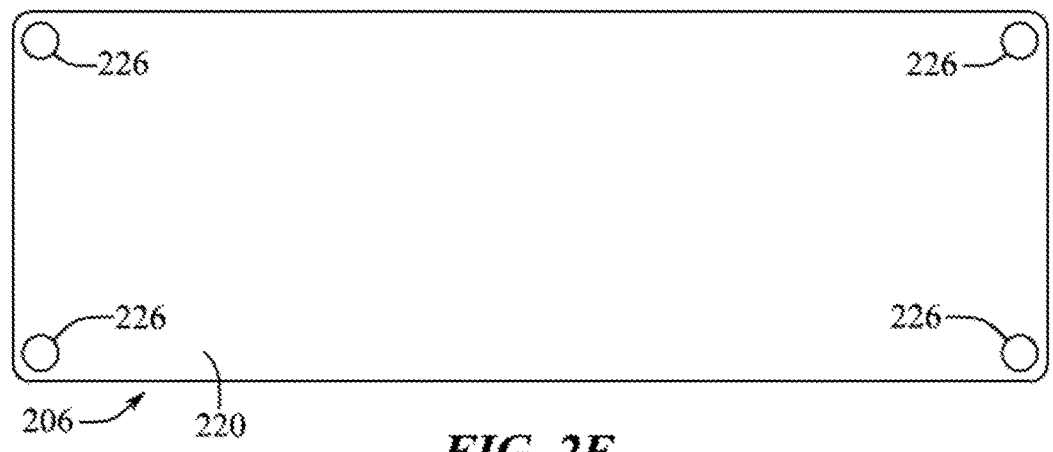
FIG. 2E shows a bottom view of the computing device of FIG. 2A.
Figure 3:
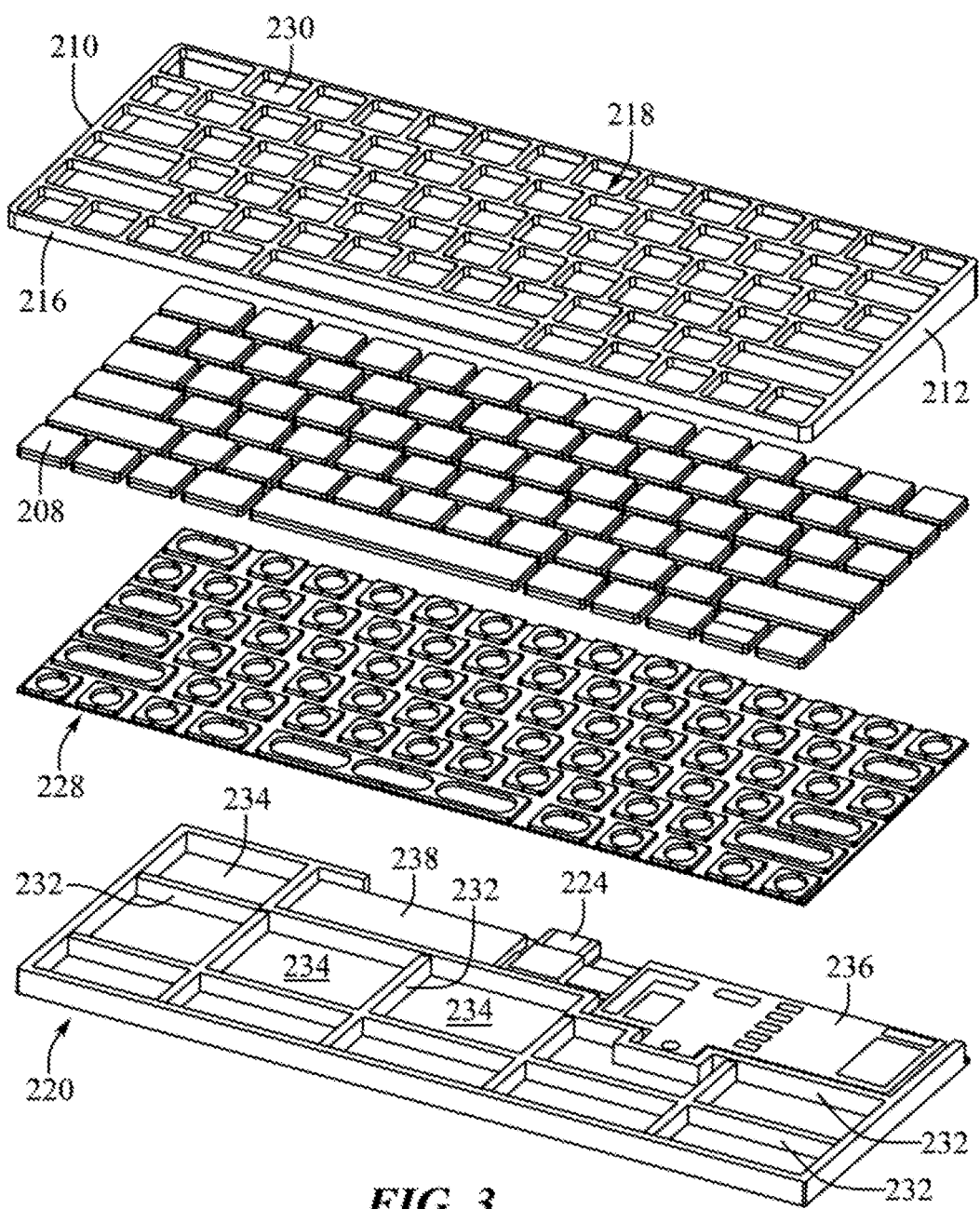
FIG. 3 shows an exploded view of the computing device of FIG. 2A.

While the examples depicted in FIGS. 2A-3 illustrate a particular quantity of keys 208 having particular sizes and shapes, the quantity of keys 208 and the particular sizes and shapes of the keys 208 can vary from one example to another. Moreover, the position of each key 208 on the enclosure 206 can be varied to accommodate other input mechanisms on the enclosure 206, such as a track pad or a fingerprint reader. Furthermore, each key 208 can be configured to receive multiple kinds of input. In some examples, the key 208 can be actuated or receive force from a user which vertically displaces the key 208. Additionally or alternatively, the key 208 can receive a touch input at a surface thereof to provide a track pad or touch pad utility, as described in relation to the track pad 302 shown in FIG. 6. For example, the touch input at the surface of the key 208 can control or operate a cursor displayed at an ancillary device (e.g., display 202) operably coupled to the computing device 200. In some examples, the key 208 can be configured to receive multi-touch input at the surface of the key 208 to enable additional operational features for a user of the computing device 200, such as, pinch, zoom, and rotate features that enable the user to manipulate a view displayed on the ancillary device.

Referring now to FIG. 2D, the enclosure 206 can define an orifice or aperture 222 having a singular input/output port (I/O port) 224 positioned therein. For example, as shown in FIG. 2D, the I/O port 224 can be positioned within the aperture 222 on the rear-facing wall 214. Although the aperture 222 is formed substantially at the center of the rear-facing wall 214 (i.e., horizontally and vertically centered) in FIG. 2D, the aperture 222 can be positioned at other locations on the rear-facing wall 214. In some examples, the aperture 222 can be defined by one of the first or second side walls 210, 212 or within a recessed cavity of the rear-facing wall 214, as shown in FIGS. 7A-E.

The singular I/O port 224 can, according to some examples, receive power and data from an ancillary electronic device (e.g., the computer monitor or display 202) and provide the power and data to one or more computing components (e.g., a processor, memory, graphics card, wireless transceiver, etc.) positioned within the enclosure 206. The I/O port 224 can alternatively or additionally output data from one or more computing components within the enclosure 206. As such, the I/O port 224 can communicatively couple one or more computing components within the enclosure 206 to one or more ancillary electronic devices connected to the computing device 200 (e.g., display 202). For example, the I/O port 224 can receive and retain a connector of a cable or cord that extends from the I/O port 224 to the ancillary device.

In some examples, the singular I/O port 224 can be operable to receive a universal serial bus (USB) connector or USB type-C® connector. For example, the I/O port 224 can be a USB type-C® port to support communication using USB 3.0, SuperSpeed®, and DisplayPort via a single receptacle or port (e.g., the I/O port 224). In some examples, the I/O port 224 can be an Apple Thunderbolt port (e.g., Thunderbolt 3 port) operative to support high-resolution displays and provide high data throughput through a single port (e.g., the I/O port 224). In some examples, the I/O port 224 can be an Apple Lightning port operative to provide and receive data and power. Although specific types of ports and connectors are described herein, the I/O port 224 can include any type of port or connector, as desired. Thus, the singular I/O port 224 can receive power from the display 102 while simultaneously providing data (from a processor) to the display 102 that causes the display 102 to depict or display content, as desired.

The singular I/O port 224 within the computing device 200 can simplify the process of transporting the computing device 200 to another location. Thus, a single cord or cable need only be carried or stored at the location to enable a user having the computing device 200 to obtain a desktop computing experience. Moreover, the singular I/O port 224 can eliminate the need for additional ports (and their associated hardware) unnecessarily occupying space within the finite inner cavity defined by the enclosure 206 to allow for a thinner and more lightweight computing device. Additionally, the singular I/O port 224 that receives power and data while simultaneously outputs data reduces the total number of apertures into the enclosure 206. Reducing the number of apertures within the enclosure 206 can be beneficial for making the computing device 200 water-resistant or waterproof. In some examples, the singular I/O port 224 can seal a periphery of the aperture 222 (e.g., by placing a gasket between the I/O port 224 and the aperture 222) to inhibit or prevent ingress of contaminants into the enclosure 206.

Although described herein as having a singular I/O port 224 in communication with an aperture 222 of the enclosure 206, in some examples any of the devices described herein, such as the device 200 can further include additional I/O ports in communication with additional apertures. In some examples, one or more ports can additionally be positioned at other locations on the enclosure 206, for example at one or more of the sidewalls thereof. In some examples, two or more ports can be positioned at a single wall of the enclosure, for example a rear-facing wall 214. In some examples, any of the ports of the device can be substantially similar to, and include some or all of the features of any of the ports described herein, such as I/O port 224.

As shown in FIG. 2E and in some examples, the base 220 of the enclosure 206 can include one or more feet 226. For example, a foot 226 can be positioned at each respective corner of the base 220. When placed onto a surface (e.g., a desk, table, bench, etc.), each foot 226 can interface with the surface to prevent movement of the computing device 200. The feet 226 can offset or space the base 220 of the enclosure 206 from the surface. In some examples, each foot 226 can be affixed to the base 220 or otherwise formed within the base 220. For example, the feet 226 can be made of a polymer which is adhered to the base 220. The feet 226 can also be stamped into the base 220 itself or molded onto the base using an injection molding process. Although illustrated as having a specific shape, size, number, and location, it will be appreciate that the base 220 can include any number, shape, size, or location of feet 226.

FIG. 3 shows an exploded view of the computing device 200 including the enclosure 206, the one or more keys 208, and one or more key mechanisms 228. In some examples, portions of the enclosure 206 can be disassembled or separated from one another, for example, the base 220 of the enclosure 206 can be separable from the side walls 210, 212, the forward-facing and rear-facing walls 214, 216, and the top portion 218. The first and second side walls 210, 212, the forward-facing and rear-facing walls 214, 216, and the top portion 218 can be interconnected or otherwise formed from a single piece of material (e.g., metal, plastic, or ceramic). In these examples, the base 220 of the enclosure 206 can be removably received within the other portions of the enclosure 206 to enable the other portions to fit over the base 220 like a cap or a lid.

The top portion 218 can form or define one or more apertures 230 extending through the top portion 218. One or more keys 208 can be disposed within a respective aperture 230 defined by the top portion 218. In some examples, the computing device 200 can incorporate a membrane or a skirt positioned around or adjacent to the keys 208 to prevent ingress of contaminants into the enclosure 206, such as water or dust. Non-limiting examples of membranes or skirts incorporated into devices having keys are described U.S. Patent Application Publication No. 2018/0068808, published Mar. 8, 2018, the disclosure of which is hereby incorporated by reference in its entirety.

Each key 208 can, when actuated, engage or actuate a key mechanism 228 positioned adjacent, near, or in contact with the key 208. A key mechanism 228 can enable actuation of a respective key 208 when a user provides a force to the key 208. For example, the key mechanism 228 can include a butterfly, a compliant, or a scissor hinge, a dome, and a support structure to enable actuation of each key 208 between undepressed and depressed states. Non-limiting examples of key mechanisms incorporated into keyboards are described U.S. Pat. No. 9,916,945, dated Mar. 13, 2018, the disclosure of which is hereby incorporated by reference in its entirety.

The base 220 can include structural features that increase rigidity and inhibit deformation of the base 220. For example, the base 220 can include one or more members 232 extending parallel to the base 220. In some examples, the base 220 can include members 232 that interconnect or integrate with other members 232. The members 232 can be formed integrally with the base 220, for example, the members 232 can be machined into the base 220 or molded with the base 220. The members 232 can form a grid pattern and thereby act as partitions forming sub-cavities 234 within the enclosure 206. One or more computing components can be positioned within the sub-cavities 234. Although the members 232 shown in FIGS. 3 and 4A-C form a grid pattern having rectangular sub-cavities 234, other geometric shapes can form a grid pattern within the base, such as triangles, squares, circles, ovals, other geometric shapes, or a combination thereof.

As shown in FIGS. 3 and 4A-C, the singular I/O port 224, a processing unit 236, and a memory 238 can be positioned within the sub-cavity 234. In some examples, these computing components can be positioned within one of the sub-cavities 234, such as one of the sub-cavities having the largest amount of available volume between the top portion 218 and the base 220 (e.g., nearest the rear-facing wall 214 of the enclosure 206). In other words, the sub-cavities 234 nearest the rear-facing wall 214 can have more capacity or volume for storing computing components than the sub-cavities 234 nearest the forward-facing wall 216 due to the wedge shape of the enclosure 206. Thus, computing components, such as the processing unit 236 and the memory 238, can be positioned nearest the rear-facing wall 214.

As shown in FIG. 3, the processing unit 236 and the memory 238 are positioned within an internal volume or an inner cavity defined by the enclosure 206. The processing unit 236 can be operatively connected to the memory 238. The processing unit 236 can include one or more computer processors or microcontrollers that perform operations in response to receiving computer-readable instructions. The processing unit 236 can include a central processing unit (CPU) of the computing device 200. Additionally or alternatively, the processing unit 236 can include other processors within the computing device 200 including application specific integrated chips (ASIC) and other microcontrollers.

The memory 238 can include a variety of types of non-transitory computer-readable storage media, including, for example, read access memory (RAM), read-only memory (ROM), erasable programmable memory (e.g., EPROM and EEPROM), or flash memory. The memory 238 can store the computer-readable instructions. Additionally or alternatively, the memory 238 can include a variety of types of non-transitory computer-readable storage media including, for example, a hard-drive storage device, a solid state storage device, a portable magnetic storage device, or other similar device.

The processing unit 236 can read computer-readable instructions stored on the memory 238. The computer-readable instructions can cause the processing unit 236 to perform the operations, functions, and aspects of the disclosure described herein. The computer-readable instructions can be provided as a computer-program product, a software application, or the like.

In some examples, the computing device 200 can also include one or more power supplies or power sources positioned within the enclosure 206 and operably coupled to the computing components (e.g., the I/O port 224, the processing unit 236, the memory 238, and/or other computing components). For example, the computing device 200 can include one or more power supplies positioned within one or more of the sub-cavities 234. The one or more power supplies can be rechargeable and can provide electrical power to the computing components of the computing device 200. While the computing device 200 is operably coupled to an ancillary device (e.g., display 202), the power supply can be charged by electrical power received via the singular I/O port 224. When the computing device 200 is being transported to another location, however, the power supply, for example, including a battery or capacitor, can provide electrical power to one or more of the computing components to preserve user content or volatile data that would otherwise be lost during transport. The one or more power supplies can include any device capable of storing and discharging electricity, such as one or more lithium-ion polymer batteries or other forms of electrical power storage.

In some examples, the power supply of the computing device 200 can include an inductive charging coil. The inductive charging coil can enable the power supply of the computing device 200 to charge using resonant inductive coupling, for example, while the computing device 200 is positioned over or adjacent to a charging pad. In some examples, the inductive charging coil can provide between 5 and 15 watts of electrical power to the power supply of the computing device 200. The inductive charging coil can be configured to operate in accordance with a known charging technology, such as, the Qi open interface standard for wireless power transfer or other mechanism for wirelessly charging an electronic device.

FIG. 4A shows a top section-view of the computing device 200 taken through the section line 4A, 4B of FIG. 2C. The section-view in FIG. 4A depicts an example of the computing device 200 having the I/O port 224, the processing unit 236, and the memory 238 positioned within the enclosure 206 and adjacent the rear-facing wall 214. In some examples, one or more walls of the enclosure 206, such as the rear-facing wall 214, can define or form one or more vents 240. For example, the one or more vents 240 can include a plurality of apertures stamped, machined, or otherwise formed within or defined by the enclosure 206. The one or more vents 240 can provide an airflow pathway through the internal volume of the enclosure 206.

When the computing device 200 is operating, the computing components, such as the processing unit 236, can generate heat or otherwise radiate heat within the enclosure 206. Elevated operating temperatures within the enclosure 206 can cause reduced levels of performance. As such, radiated heat from the computing components can cause a temperature variance between the air within the enclosure 206 and the ambient air outside of the enclosure 206. To assist with thermal management, the temperature variance can cause the relatively cooler ambient air outside of the enclosure 206 to be drawn in through the one or more vents 240, while also causing the relatively warmer air within the enclosure 206 to be exhausted through the vents 240. In this manner, the vents 240 can facilitate a natural or passive air circulation system to regulate heat within the enclosure 206 of the computing device 200. The vents 240 can consist of apertures or through-holes formed or otherwise defined by the enclosure 206. For example, the vents 240 can include elongated parallel slots, channels, perforations, other apertures, or a combination thereof.

As shown in FIG. 4A, warmer air positioned adjacent the computing components within the enclosure 206 can be drawn out of each respective vent 240 along an airflow pathway (designated as reference arrows 242 in FIG. 4A). Simultaneously, cooler ambient air outside of the enclosure 206 can be drawn through each respective vent 240 and into the enclosure 206 through an airflow pathway (designated as reference arrows 244 in FIG. 4A). Thus, heat generated by the one or more computing components disposed in the enclosure 206 can be dissipated or reduced via air circulated through the one or more vents 240 along the airflow pathways.

FIG. 4B shows a top section-view of the computing device 200 taken through the section line 4A, 4B of FIG. 2C. The section-view in FIG. 4B depicts an example of the computing device 200 having the singular I/O port 224, the processing unit 236, the memory 238, and one or more air-moving apparatuses 246 positioned within the enclosure 206 and adjacent the rear-facing wall 214. Each air-moving apparatus 246 can be positioned near or adjacent to respective vents 240a, 240b to draw air along an airflow pathway. The airflow pathway can extend from outside of the enclosure (as designated by the reference arrows 248 in FIG. 4B), through a first vent 240a, and into the internal volume of the enclosure 206 (as designated by the reference arrows 250 in FIG. 4B). The airflow pathway can extend from the internal volume (as designated by arrows 252 in FIG. 4B), through a second vent 240b, and into an ambient environment adjacent the enclosure 206.

In some examples, the one or more air-moving apparatuses 246 can be one or more fans, such as a fan having multiple blades attached to an electric motor. The air-moving apparatuses 246 can be operably coupled to the processing unit 236 and receive electrical power from the I/O port 224, the processing unit 236, the power supply, or a combination thereof. The processing unit 236 can activate or run the air-moving apparatuses 246 at the occurrence of an event, such as meeting or exceeding a temperature threshold within or at any location on the enclosure 206. In some examples, the air-moving apparatuses 246 can be activated or otherwise operate when a particular computing component reaches a predetermined temperature, for example, when the processing unit reaches or exceeds 60° C.

As illustrated in FIGS. 4A-4C, the airflow pathway or pathways can extend above or adjacent to one or more computing components within the enclosure 206 to draw or move heat from the computing components, while also supplying cooler ambient air to the internal volume or inner cavity of the enclosure 206. The rate at which air is drawn or moved along the airflow pathway can be at least partially based on an operational status of the one or more air-moving apparatuses 246. For example, the air-moving apparatuses 246 can be operated at a relatively low output mode that moves air along the airflow pathway at a rate of about 2 cubic feet per minute (CFM) to about 50 CFM. In a relatively moderate output mode, the air-moving apparatuses 246 can move air along the airflow pathway at a rate of about 50 CFM to about 200 CFM. In a relatively high output mode, the air-moving apparatuses 246 can move air along the airflow pathway at a rate of about 200 CFM or more.

In some examples, the base 220 can include a thermally conductive material. For example, the base 220 can be manufactured at least partially of a metal or other material that distributes or spreads heat substantially throughout the mass of the base 220. The base 220 can distribute heat generated, for example, by the processing unit 236, which can be in thermal communication with the base 220. The heat can be distributed over a larger surface area of the base 220 to more efficiently regulate temperatures within the enclosure 206 by allowing the heat to dissipate over a larger surface area.

Materials for the base 220 or other parts of the enclosure 206 can be chosen based on their thermal conductivity. The thermal conductivity of a material can be determined based on Equation 1 shown below, wherein k represents the thermal conductivity of the material, Q represents the heat flow, L represents a length or thickness of the material, A represents a surface area of the material, and T2 and T1 represent a temperature gradient.

$$k=Q*L/A(T2-T1) \qquad \text{Equation [1]}$$

Some non-limiting examples of thermally conductive materials are copper, aluminum, brass, steel, and bronze. The thermal conductivity of the base 220 can be less than 60 W/mK, from about 60 W/mK to about 400 W/mK, from about 100 W/mK to about 300 W/mK, from about 200 W/mK to about 250 W/mK, or greater than 400 W/mK.

FIG. 4C shows a side section-view of the computing device 200 taken through the section line 4C of FIG. 4A. More specifically, FIG. 4C shows a back-half or rear-half 254 of the computing device 200. The section-view in FIG. 4C depicts an example of the computing device 200 having the I/O port 224, the processing unit 236, and the memory 238 positioned within the enclosure 206 and adjacent the rear-facing wall 214. In some examples, a majority of the volume or the majority volume within the enclosure 206 can be formed or positioned adjacent the rear-facing wall 214 to provide space for the one or more computing components and adequate headspace for the components to accommodate airflow within the enclosure 206. Conversely, a minority volume can be formed or positioned adjacent the forward-facing wall 216. A plane P extending between the first and second side walls 210, 212 can separate the minority volume from the majority volume. The plane P can bisect the first and second side wall 210, 212 in half. The position of the one or more computing components can be biased toward the rear-facing wall 214 (i.e., the majority volume). For example, the one or more computing components can be wholly positioned within the back-half or rear-half 254 of the enclosure 206, as shown in FIG. 4C. In some examples, the computing components can be positioned within a rear-third or rear-quarter of the computing device 200.

Any number or variety of components in any of the configurations described herein can be included in the computing device. The components can include any combination of the features described herein and can be arranged in any of the various configurations described herein. The arrangement of components of the computing device having an enclosure described herein, and defining an internal volume, can apply not only to the specific examples discussed herein, but to any number of embodiments in any combination. An example of a computing device including components having various features in various arrangements is described below, with reference to FIG. 5.

Any number or variety of components in any of the configurations described herein can be included in the computing device. The components can include any combination of the features described herein and can be arranged in any of the various configurations described herein. The arrangement of components of the computing device having an enclosure described herein, and defining an internal volume, can apply not only to the specific examples discussed herein, but to any number of embodiments in any combination. Another example of a computing device including components having various features in various arrangements is described below, with reference to FIG. 5.

Figure 5:
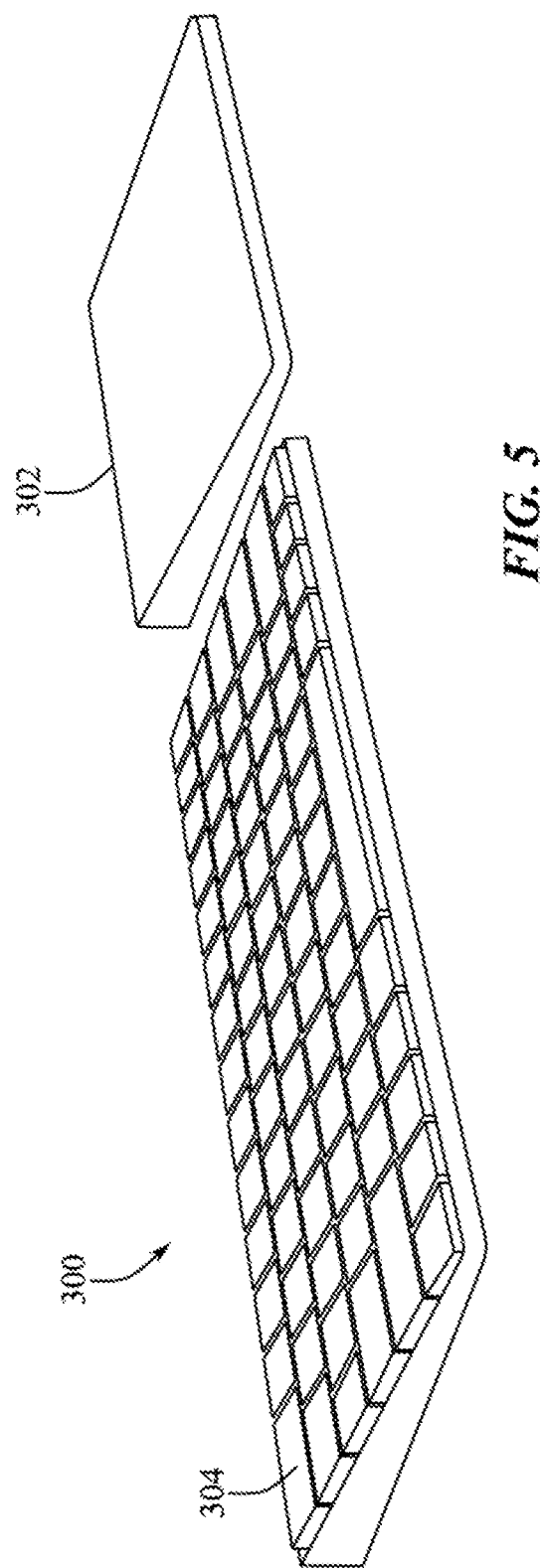
FIG. 5 shows a perspective view of a computing device and an input device.

FIG. 5 shows a computing device 300 and an ancillary input device (e.g., track pad 302). The computing device 300 can have some or all of the same components and functionality as the computing devices previously disclosed herein. For example, the computing device 300 can have the same components and functionality as the computing device 100 described with reference to FIGS. 2A-4C. While the computing device 300 can include a set of keys 304 to receive input from a user of the device 300, the computing device 300 can also be communicatively coupled to an ancillary input device (e.g., track pad 302). The computing device 300 can be communicatively coupled to the track pad 302 via a wired or a wireless connection, for example, a cable interconnecting the two devices or a wireless protocol such as IEEE 802 (i.e., Bluetooth and Wi-Fi wireless networking technologies). Any other method for communicatively coupling the computing device 300 with the track pad 302 is also contemplated within this disclosure, such as, a USB based connection, and other wired connections.

The track pad 302 can control or operate a cursor displayed at an ancillary device (e.g., display 202) operably coupled to the computing device 300. As such, the track pad 302 can detect a touch and/or force input to determine a direction in which a cursor or other indicator, displayed at display 202, can move (e.g., in response to a user input signal associated with the cursor movement). Thus, multiple discrete touch and/or force inputs can be compared across the track pad 302 to determine a direction of motion of a user's finger across the track pad 302. A user input signal can be generated that instructs the computing device 300 to display the cursor in a new position based on the determined direction of motion. While the track pad 302 is illustrated as a separate and distinct device, the track pad 302 can be physically coupled to the computing device 300 in some examples. For example, the track pad 302 can be magnetically coupled to the enclosure of the computing device 300. Although described as a track pad 302, in some examples, the ancillary input component 302 can include any variety or combination of input components as desired.

Figure 6A:
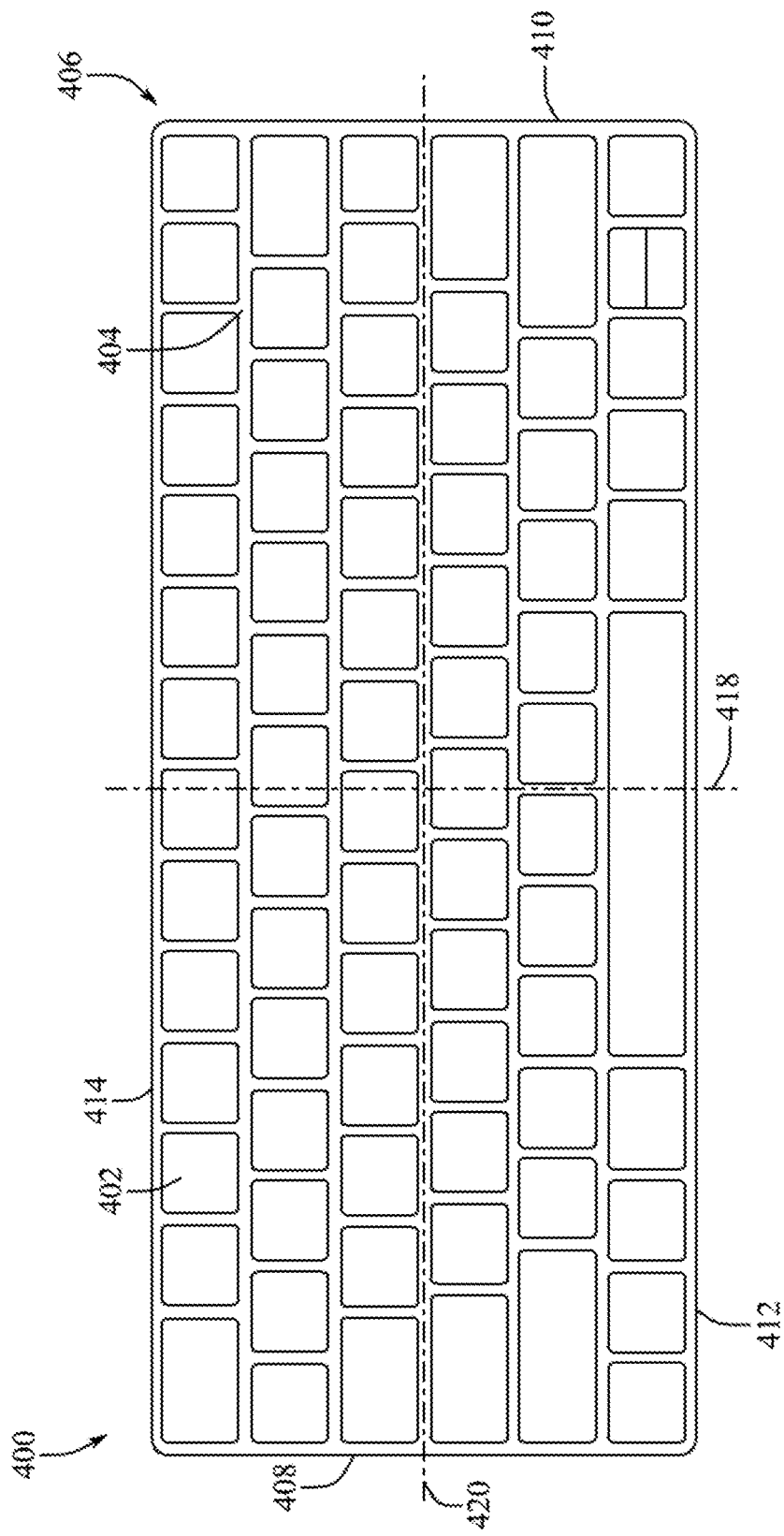
FIG. 6A shows a top view of a computing device.
Figure 6B:
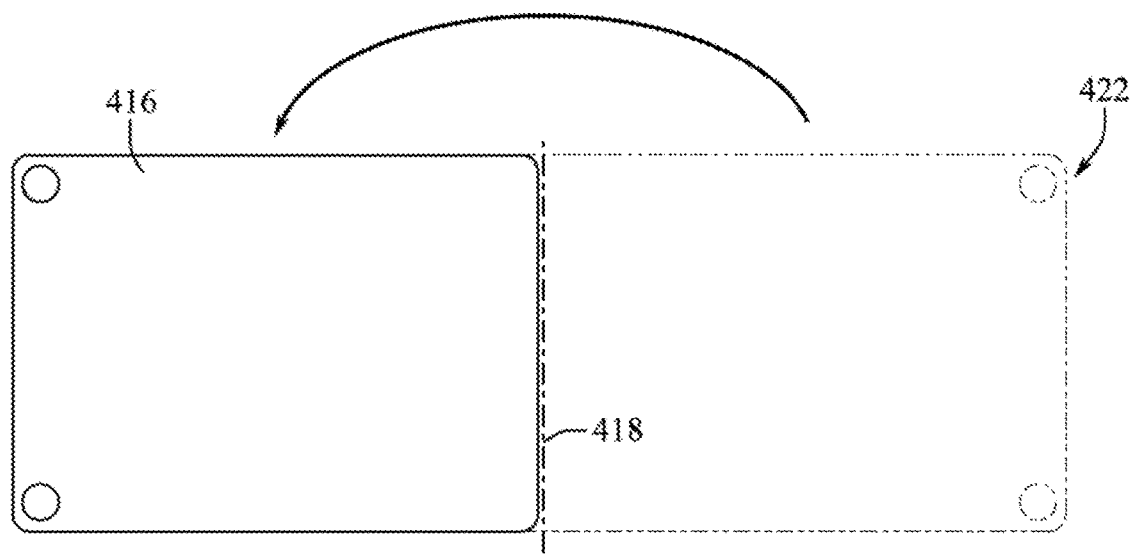
FIG. 6B shows a bottom view of the computing device of FIG. 6A.
Figure 6C:
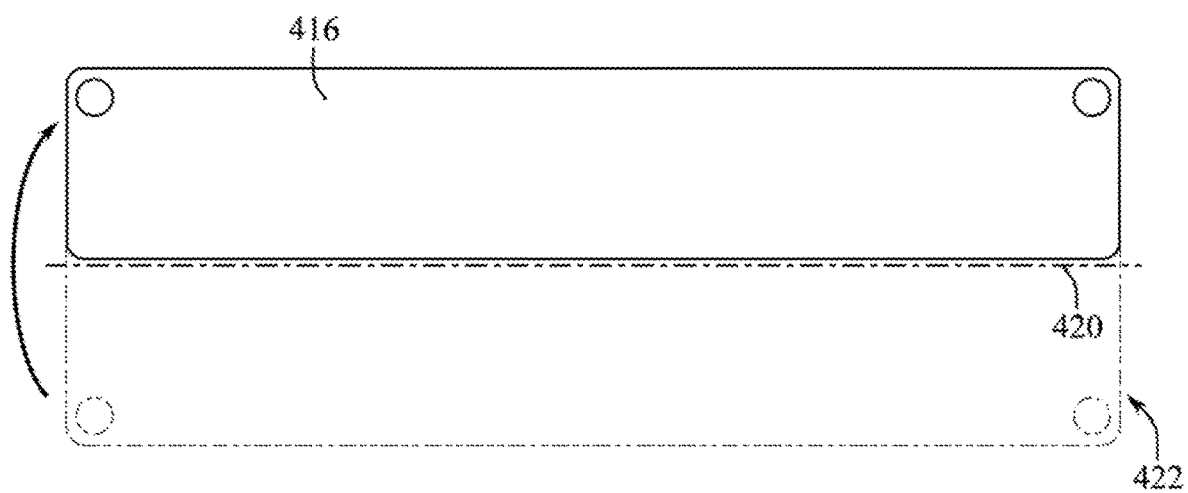
FIG. 6C shows a bottom view of the computing device of FIG. 6A arranged in an alternative configuration.

FIGS. 6A-6C depict a computing device 400. The computing device 400 can be substantially similar to, and can include some or all of the features of any of the computing devices disclosed herein, such as computing devices 100, 200, 300. In some examples, the computing device 400 can include one or more keys 402 positioned at an external surface (e.g., top portion 404) of an enclosure 406. The enclosure 406 can also include first and second side walls 408, 410, forward-facing and rear-facing walls 412, 414, and a base 416. The computing device 400 can also include computing components (not shown) disposed within the enclosure 406. For example, the computing device 400 can include one or more, processing units, memories, power supplies, video cards, I/O ports, wireless transceivers, other computing components, or combinations thereof.

The computing device 400 can be foldable about one or more axis to reduce the size of the computing device 400 and otherwise ease transport of the computing device 400 from one location to another. For example, the computing device 400 can include a hinge mechanism, such as, one or more barrel hinges, living hinges, butt hinges, piano hinges, butterfly hinges, flush hinges, pivot hinges, spring hinges, other types of hinges, or a combination thereof.

In some examples, the computing device 400 can be foldable about a first axis 418 positioned between the first and second side walls 408, 410 and extending perpendicularly from the rear-facing wall 414. In some examples, as shown in FIG. 6B, a footprint 422 of the computing device 400 can be halved or substantially halved when the computing device 400 is folded about the first axis 418. While halved, the keys 402 of the computing device 400 can engage or interface one another, and the base 416 can face outwardly to protect the folded computing device 400 from potential damage while being transported. The one or more of the hinge mechanisms (not shown) can be positioned along the first axis 418 to enable the computing device 400 to be folded about the first axis 418.

In some examples, the computing device 400 can additionally or alternatively be foldable about a second axis 420 positioned between the forward-facing and rear-facing walls 412, 414 and extending substantially parallel to the rear-facing wall 414. In some examples, as shown in FIG. 6C, the footprint 422 of the computing device 400 can be halved or substantially halved when the computing device is folded about the second axis 420. While halved, the keys 402 of the computing device 400 can engage or interface one another and the base 416 can face outwardly to protect the folded computing device 400 from potential damage while being transported. The one or more of the hinge mechanisms (not shown) can be positioned along the second axis 420 to enable the computing device 400 to be folded about the second axis 420. While the examples shown in FIGS. 6A-C illustrate first and second axis 418, 420, the computing device can be folded about other axes, as desired. For example, the computing device can be foldable about two axes, each of the two axes being parallel to the first and second walls 408, 410, such that the computing device is divided into three parts (i.e., the two axis can allow a user to fold the computing device like a paper can be folded into three equal parts before being inserted into an envelope).

Any number or variety of components in any of the configurations described herein can be included in the computing device. The components can include any combination of the features described herein and can be arranged in any of the various configurations described herein. The arrangement of components of the computing device having an enclosure described herein, and defining an internal volume, can apply not only to the specific examples discussed herein, but to any number of embodiments in any combination. Various examples of a computing device including components having various features in various arrangements are described below, with reference to FIG. 7A-E.

Figure 7D:
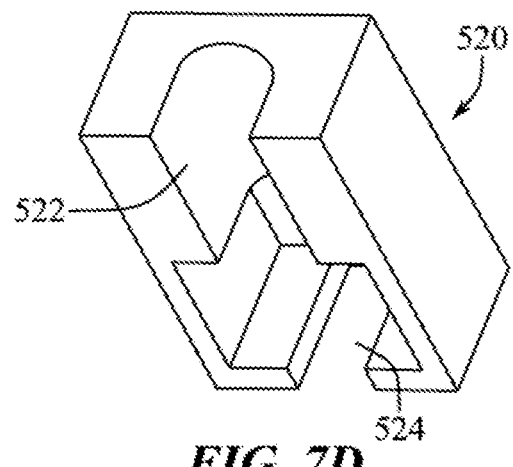
FIG. 7D shows a perspective view of an insert for a computing device.

FIGS. 7A-E illustrate various examples for coupling and/or retaining a cable to a computing device 500. The computing device 500 can be the same as or substantially similar to, and can include some or all of the features of the computing devices described herein. FIG. 7A shows the bottom of a computing device 500 including an enclosure 502 having first and second side walls, forward-facing and rear-facing walls, and a base 512. In some examples, the base 512 and rear-facing wall 510 of the enclosure 502 can form or define a cavity 514 for receiving and retaining at least a portion of a cable 516 (see FIG. 7C). As such, the cavity 514 can include the aperture and singular I/O port, such as the aperture 122 and singular I/O port 124 shown in FIGS. 2D and 4A-B for receiving the cable 516.

As shown in FIG. 7B, a slot or a gap 518 can be formed within the rear-facing wall 508. The gap 518 can provide an interference or compression fit for a portion of the cable 516 positioned within the gap 518 such that the cable 516 is retained to the computing device 500. In other words, the cable 516 can be contacted by one or more surfaces which define the gap 518 to retain the cable in a fixed position relative to the computing device 500. The compressive forces applied by the gap 518 onto the cable 516 can inhibit or prevent the cable 516 from being removed from the cavity 514.

The dimensions or size of the gap 518 can vary relative to the cable 516 being utilized with the computing device 500. For example, the gap 518 can be less than 2 mm across, from about 2 mm across to about 10 mm across, from about 4 mm across to about 8 mm across, or greater than 10 mm across. In some examples, size of the gap 518 can vary along the length of the gap 518 to provide a coupling interface that accommodates cables of varying diameters. For example, the size of the gap 518 can vary from about 4 mm to about 2 mm across along the length of the gap 518. In some examples, the gap 518 can be 3 mm across to provide an interference fit for an Apple Lightning cable, an Apple Thunderbolt cable, or another cable operative to receive data and power to the computing device 500 and distribute data and power from the computing device 500. FIG. 7C shows a bottom view of the cable 516 received and retained within the cavity 514 formed within the base 512.

Figure 7E:
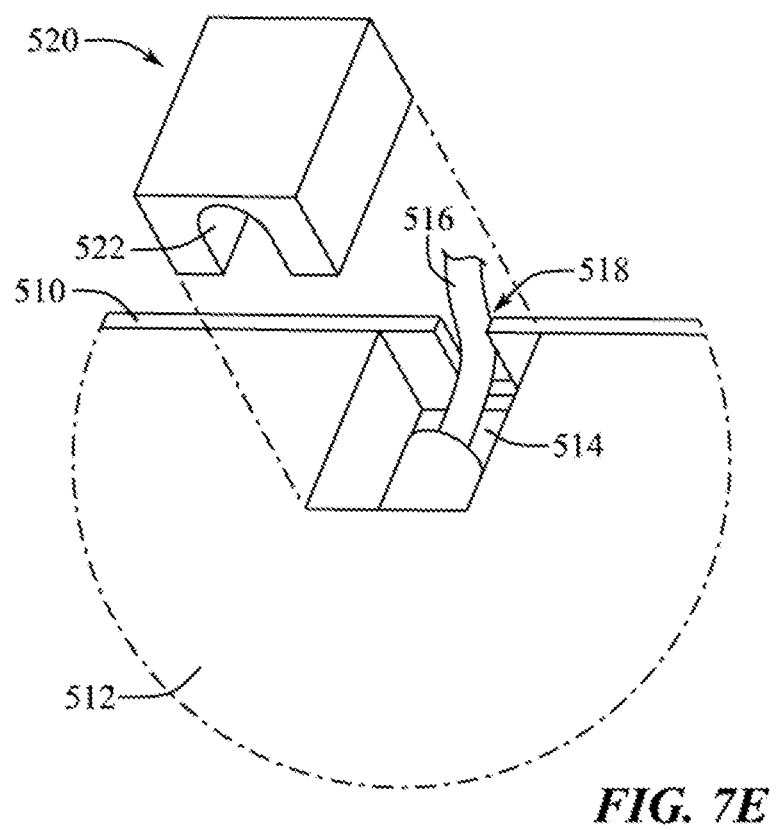
FIG. 7E shows a perspective view of the insert shown in FIG. 7D and a computing device.

FIGS. 7D and 7E show examples of an insert 520 that can be received within the cavity 514 to retain the cable 516 within the cavity 514. The insert 520 can form or define a recess 522 shaped to encompass or surround at least a portion of the cable 516 within the cavity 514. The insert 520 can define or form an insert gap 524 in fluid communication with the recess 522. In some examples, the insert gap 524 can substantially align with the gap 518 formed on the rear-facing wall 510 of the enclosure 502 to accommodate a cable (e.g., cable 516). The cable 516 can extend through the recess 522 of the insert 520 and into an I/O port (not shown) positioned within the cavity 514. As described herein, while positioned within the cavity 514, the insert 520 can provide a mechanical interference that restricts or otherwise inhibits removal of the cable 516 from the cavity 514.

In some examples, the cavity 514 can be defined or formed as a five-sided box, and the insert 520 can have an outer profile that fits within the five-sided box. In other examples, the cavity 514 can be cylindrical in shape and the insert 520 can have an outer profile that fits within the cylindrical shape of the cavity 514. Cavities having other geometric shapes are also contemplated within this disclosure including triangular, rectangular, ellipsoidal, semi-spherical, other geometric shapes, or combinations thereof.

Any number or variety of components in any of the configurations described herein can be included in the computing device. The components can include any combination of the features described herein and can be arranged in any of the various configurations described herein. The arrangement of components of the computing device having an enclosure described herein, and defining an internal volume, can apply not only to the specific examples discussed herein, but to any number of embodiments in any combination. Another example of a computing device including components having various features in various arrangements is described below, with reference to FIG. 8.

Figure 8:
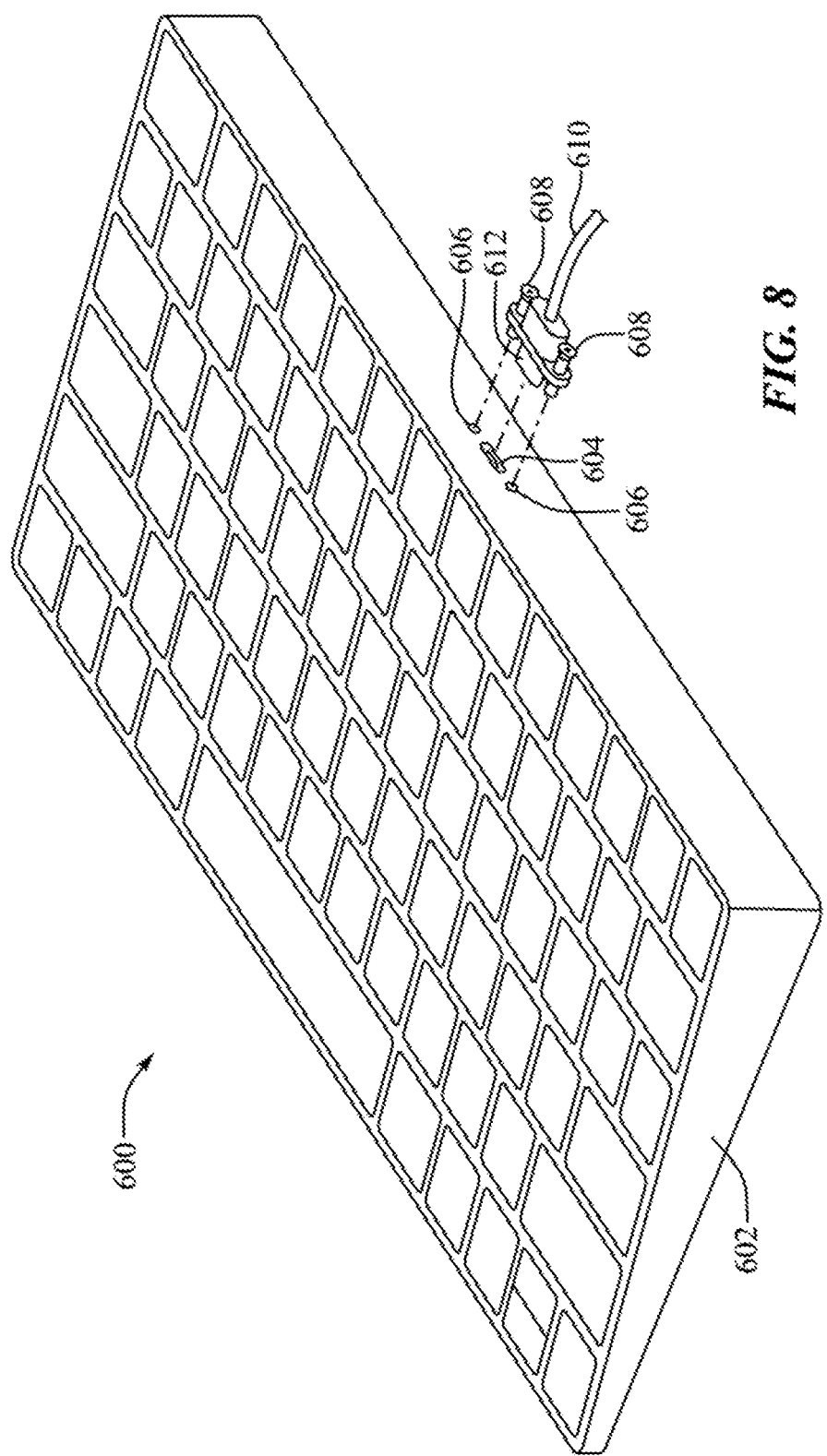
FIG. 8 shows a perspective view of a computing device.

FIG. 8 shows a computing device 600 including an enclosure 602 and a singular I/O port 604 positioned within the enclosure 602. The computing device 600 can be substantially similar to, and can include some or all of the features of the computing devices described herein. The enclosure 602 can define one or more apertures 606 positioned adjacent the I/O port 604. The one or more apertures 606 can each receive a respective fastener 608. The apertures 606 or components or features within the enclosure 602 can secure the fasteners in place, as desired. For example, the apertures 606 can be threaded and can receive corresponding threads of the fasteners 608. The fasteners 608 can be coupled or otherwise attached to a cable 610. A connector 612 of the cable 610 can be receivable within the I/O port 604 to provide electrical power and data to the computing device 600. While the connector 612 is received within the I/O port 604, the fasteners 608 can be threaded into respective threaded apertures 606 to retain the connector 612 within the I/O port 604.

Any number or variety of components in any of the configurations described herein can be included in the computing device. The components can include any combination of the features described herein and can be arranged in any of the various configurations described herein. The arrangement of components of the computing device having an enclosure described herein, and defining an internal volume, can apply not only to the specific examples discussed herein, but to any number of embodiments in any combination. Another example of a computing device including components having various features in various arrangements is described below, with reference to FIG. 9.

Figure 9:
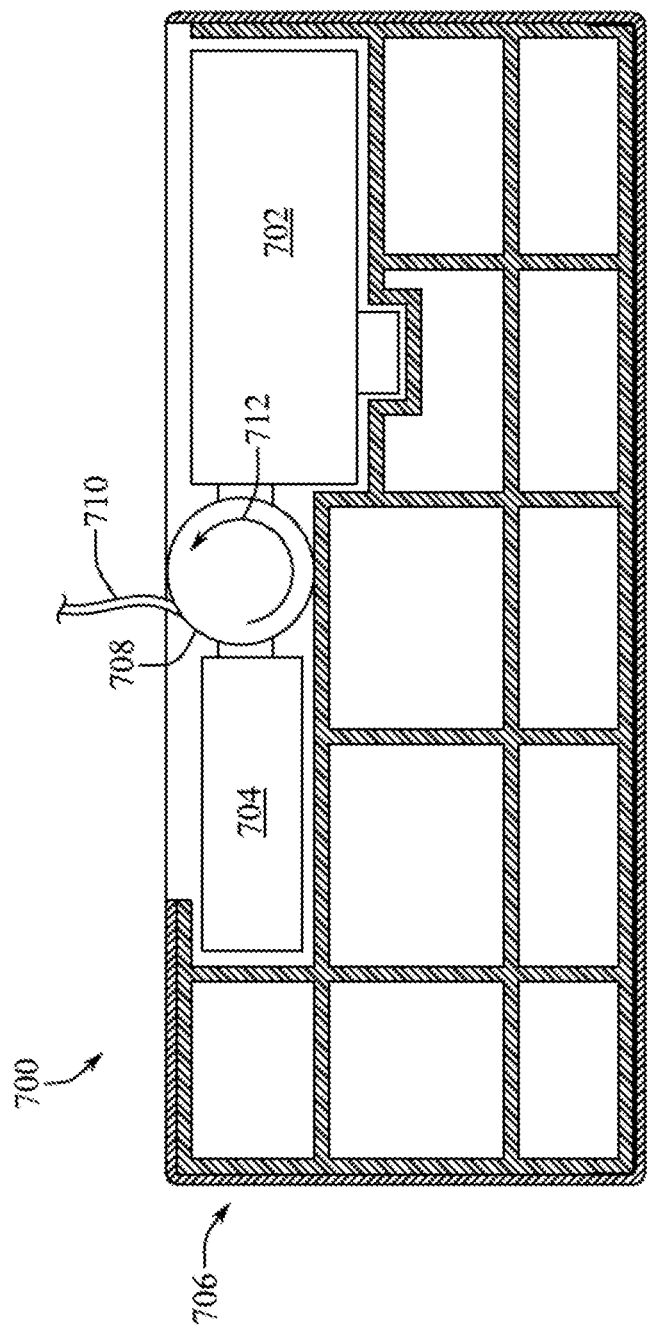
FIG. 9 shows a top cross-section view of a computing device.

FIG. 9 shows a section view of a computing device 700. The computing device 700 can include one or more of the components described in relation to the embodiments of computing devices 100, 200, 300, 400, 500, or 600. For example, the computing device 700 can include a processing unit 702 and a memory 704 disposed within an enclosure 706 or any other component disclosed herein. The computing device 700 can also include a cable spindle 708 that dispenses and retracts a cable 710. The cable spindle 708 can rotate about a central axis to retract and dispense the cable 710. For example, the cable spindle 708 can retract or take-in cable 710 when the cable spindle 708 is rotated in a counter-clockwise direction (as designated by arrow 712 in FIG. 9). Alternatively, the cable spindle 708 can dispense or let-out the cable 710 when the cable spindle 708 is rotated in a clock-wise direction.

In some examples, the cable spindle 708 can include a biasing component (not shown) which biases the cable spindle to rotate to take-in or retract the cable 710. The cable spindle 708 can communicatively couple one or more of the computing components within the enclosure 706, for example, the cable spindle 708 can communicatively couple the processing unit 702 with the memory 704. The cable 710 can communicatively couple the computing device 700 to one or more ancillary devices (e.g., a display). The cable 710 can provide electrical power and data to the computing device from the ancillary device. Moreover, the cable 710 can receive electrical power and data to from the ancillary device.

While the present disclosure generally describes computing devices and related components and features, the components, features, and devices described herein can be used in any combination or order and with any component or electronic device as desired. Further, the components and features can assume any geometric shape, pattern, size, or combination of shapes, patterns, and sizes. Additionally, the input components or other features described herein can be positioned on or extend from any surface or surfaces of any desired enclosure and/or components.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A computing device, comprising:
   an enclosure at least partially defining an internal volume and an external surface, the enclosure including a first side wall, a second sidewall opposite the first side wall, and a rear-facing wall extending between the first side wall and the second side wall, the rear-facing wall defining an intake vent and an exhaust vent;
   a keyboard positioned at the external surface;
   a processing unit disposed within the internal volume adjacent the intake vent and in thermal communication with the enclosure;
   a memory communicatively coupled to the processing unit, the memory disposed within the internal volume adjacent the exhaust vent;
   a singular input/output port positioned at an orifice defined by the enclosure between the processing unit and the memory and communicatively coupled to the processing unit and the memory, the singular input/output port configured to:
   receive signals and power; and
   output signals from the processing unit.

2. The computing device of claim 1, wherein the enclosure comprises a metal or a composite material.

3. The computing device of claim 1, further comprising a track pad communicatively coupled to the processing unit.

4. The computing device of claim 1, wherein the keyboard further comprises a capacitive touch sensor.

5. The computing device of claim 1, further comprising a power supply disposed within the internal volume.

6. The computing device of claim 1, wherein the singular input/output port comprises a USB type-C port.

7. A computing device, comprising:
   an enclosure defining an internal volume, the enclosure including a sidewall defining, an input/output port, an intake vent, and an exhaust vent;
   a keyboard positioned on the enclosure;
   a processing unit disposed within the internal volume;
   a memory communicatively coupled to the processing unit, the memory disposed within the internal volume; and
   an air-moving apparatus disposed within the internal volume to move air along an airflow pathway from an ambient environment into the internal volume through the intake vent and from the internal volume into the ambient environment through the exhaust vent;
   wherein:
   the processing unit is disposed in the airflow pathway;
   the memory is disposed in the airflow pathway; and
   the input/output port is disposed between the processing unit and the memory.

8. The computing device of claim 7, wherein the enclosure comprises a metal or a composite material.

9. The computing device of claim 7, wherein the air-moving apparatus comprises a bladed fan.

10. A computing device, comprising:
    an enclosure defining an internal volume and an external surface, the enclosure comprising a base having a first side wall, a second sidewall opposite the first side wall, and a rear-facing wall extending between the first side wall and the second side wall, the rear-facing wall defining a first vent and a second vent, the enclosure comprising a thermally conductive material;
    a keyboard positioned at the external surface;
    a processing unit disposed within the internal volume adjacent the first vent and in thermal communication with the base;
    a memory communicatively coupled to the processing unit, the memory disposed within the internal volume adjacent the second vent; and
    an input/output port positioned between the processing unit and the memory.

11. The computing device of claim 10, wherein the enclosure comprises aluminum.

12. The computing device of claim 10, further comprising an inductive charging coil disposed within the internal volume.

13. The computing device of claim 10, wherein the base comprises a metal or a metal alloy.

* * * * *